US012094781B2

(12) United States Patent
Miura et al.

(10) Patent No.: US 12,094,781 B2
(45) Date of Patent: Sep. 17, 2024

(54) MANUFACTURING METHOD OF THREE-DIMENSIONAL SEMICONDUCTOR DEVICE

(71) Applicant: Hitachi High-Tech Corporation, Tokyo (JP)

(72) Inventors: Makoto Miura, Tokyo (JP); Kiyohiko Sato, Tokyo (JP); Yasushi Sonoda, Tokyo (JP); Satoshi Sakai, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 923 days.

(21) Appl. No.: 16/971,449

(22) PCT Filed: Sep. 13, 2019

(86) PCT No.: PCT/JP2019/035998
§ 371 (c)(1),
(2) Date: Aug. 20, 2020

(87) PCT Pub. No.: WO2021/048995
PCT Pub. Date: Mar. 18, 2021

(65) Prior Publication Data
US 2021/0082766 A1   Mar. 18, 2021

(51) Int. Cl.
H01L 21/8234    (2006.01)
H01J 37/32     (2006.01)
(Continued)

(52) U.S. Cl.
CPC .. *H01L 21/82345* (2013.01); *H01J 37/32082* (2013.01); *H01J 37/3244* (2013.01);
(Continued)

(58) Field of Classification Search
CPC .......... H01L 21/82345; H01L 29/0673; H01L 29/66787; H01L 29/42392; H01L 29/78696
See application file for complete search history.

(56) References Cited

U.S. PATENT DOCUMENTS 9,484,406 B1 * 11/2016 Sun ................. H01L 29/165
11,515,334 B2 * 11/2022 Huang ............ H01L 21/823481
(Continued)

FOREIGN PATENT DOCUMENTS

JP    2006080519 A    3/2006
JP    2011066151 A    3/2011
(Continued)

OTHER PUBLICATIONS

Office Action mailed Feb. 25, 2022 in Korean Application No. 10-2020-7017074.
(Continued)

*Primary Examiner* — Kevin Parendo
(74) *Attorney, Agent, or Firm* — Miles & Stockbridge, P.C.

(57) ABSTRACT

A manufacturing process for a three-dimensional structure device having stacked channels in which channels having a shape of a thin line or a sheet are stacked in a direction vertical to a substrate, a work function control metal is separately formed without expanding a space between FETS having different threshold voltages, and including a first step of performing anisotropic etching to open the mask material until the work function control metal film is exposed; a second step of depositing a protective film; a third step of performing anisotropic etching to remove the protective film while remaining the protective film deposited on sidewalls of the mask material opened in the first step; and a fourth step of performing isotropic etching to selectively remove the mask material between the channels relative to the protective film and the work function control metal film are executed.

4 Claims, 26 Drawing Sheets

(51) Int. Cl.
  *H01L 29/40* (2006.01)
  *H01L 29/423* (2006.01)
  *H01L 29/786* (2006.01)
(52) U.S. Cl.
  CPC .................. *H01J 37/32715* (2013.01); *H01L 21/823412* (2013.01); *H01L 21/823431* (2013.01); *H01L 29/401* (2013.01); *H01L 29/42392* (2013.01); *H01L 29/78696* (2013.01); *H01J 2237/332* (2013.01); *H01J 2237/334* (2013.01)

(56) References Cited

U.S. PATENT DOCUMENTS

| | | |
|---|---|---|
| 2006/0049429 A1 | 3/2006 | Kim et al. |
| 2011/0061811 A1 | 3/2011 | Ito et al. |
| 2011/0062417 A1 | 3/2011 | Iwayama et al. |
| 2017/0250290 A1 | 8/2017 | Chang et al. |
| 2017/0309719 A1 | 10/2017 | Sun et al. |
| 2018/0308768 A1 | 10/2018 | Mochizuki et al. |
| 2020/0006389 A1* | 1/2020 | Huang ................. H01L 29/6656 |

FOREIGN PATENT DOCUMENTS

| | | | | |
|---|---|---|---|---|
| JP | 2019515494 A | | 6/2019 | |
| KR | 20100012875 A | | 2/2010 | |
| KR | 101596329 B1 | | 2/2016 | |
| KR | 20210006727 A | * | 7/2019 | ........... H01L 29/423 |
| WO | 2013101007 A1 | | 7/2013 | |
| WO | 2019116827 A1 | | 6/2019 | |

OTHER PUBLICATIONS

P. Weckx et al., "Stacked nanosheet fork architecture for SRAM design and device co-optimization toward 3nm", Proceedings of IEDM 2017, pp. 505-508.
Search Report mailed Dec. 3, 2019 in International Application No., PCT/JP2019/035998.

* cited by examiner

[FIG. 1A]
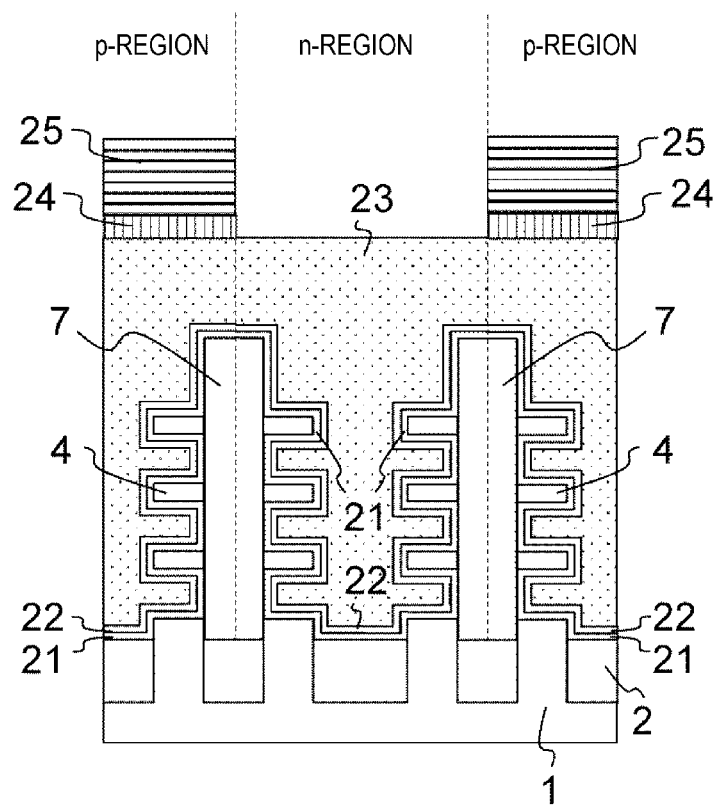

[FIG. 1B]
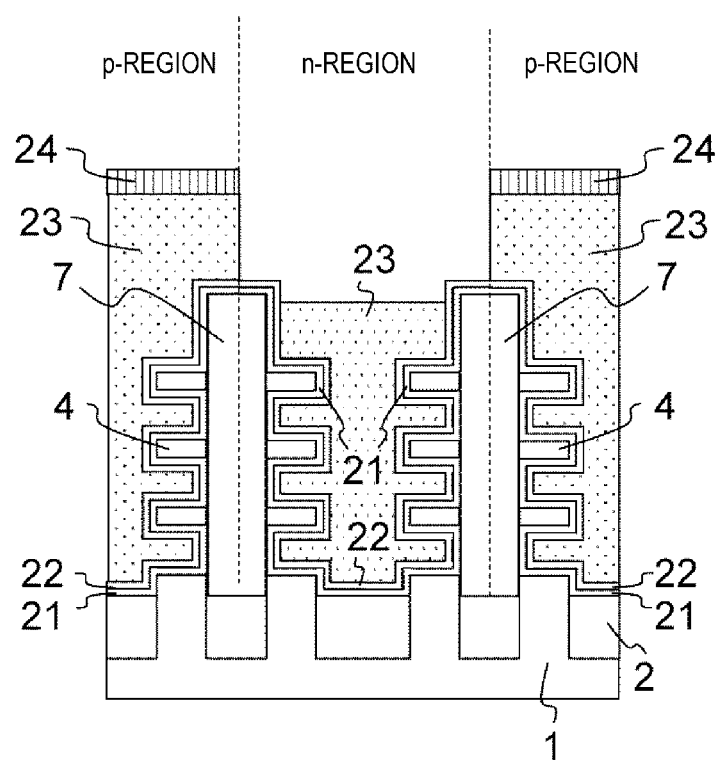

[FIG. 1C]
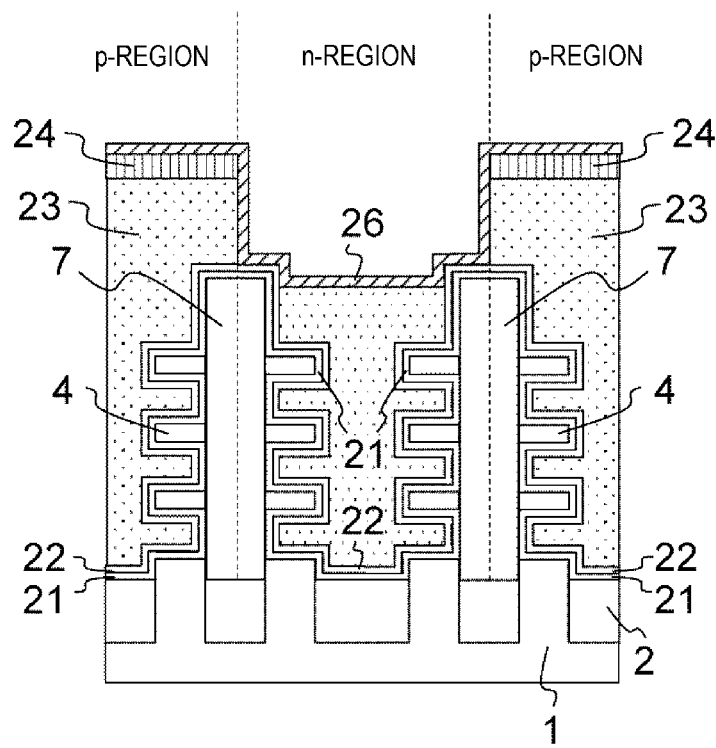

[FIG. 1D]
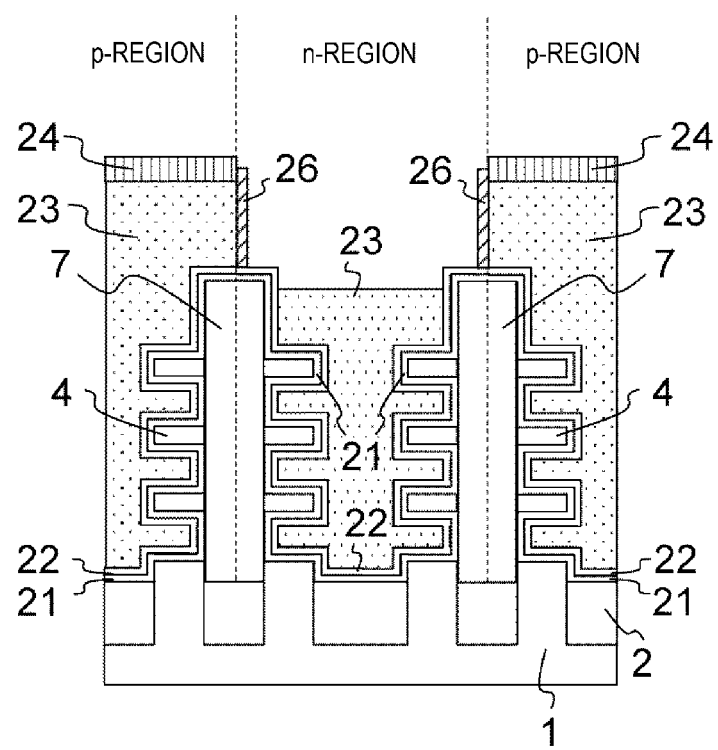

[FIG. 1E]
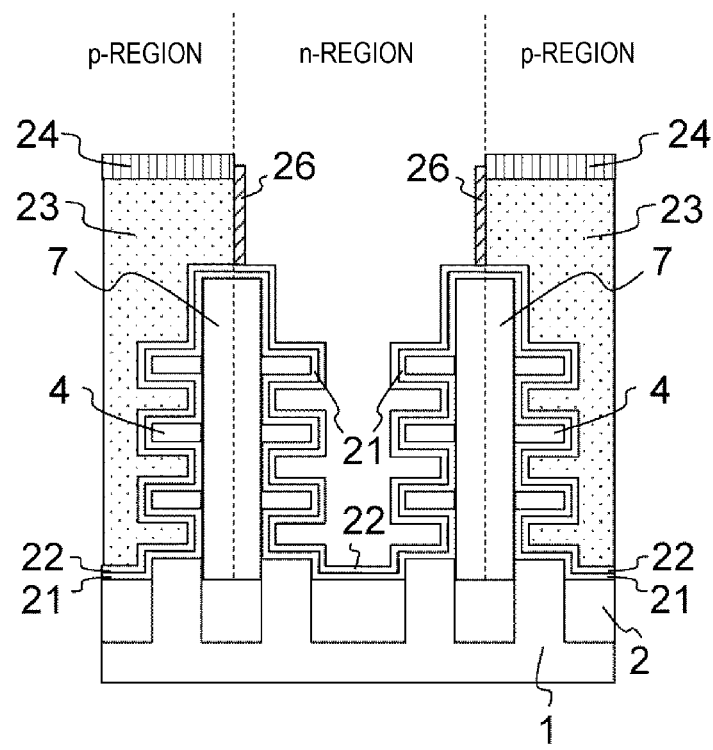

[FIG. 2A]
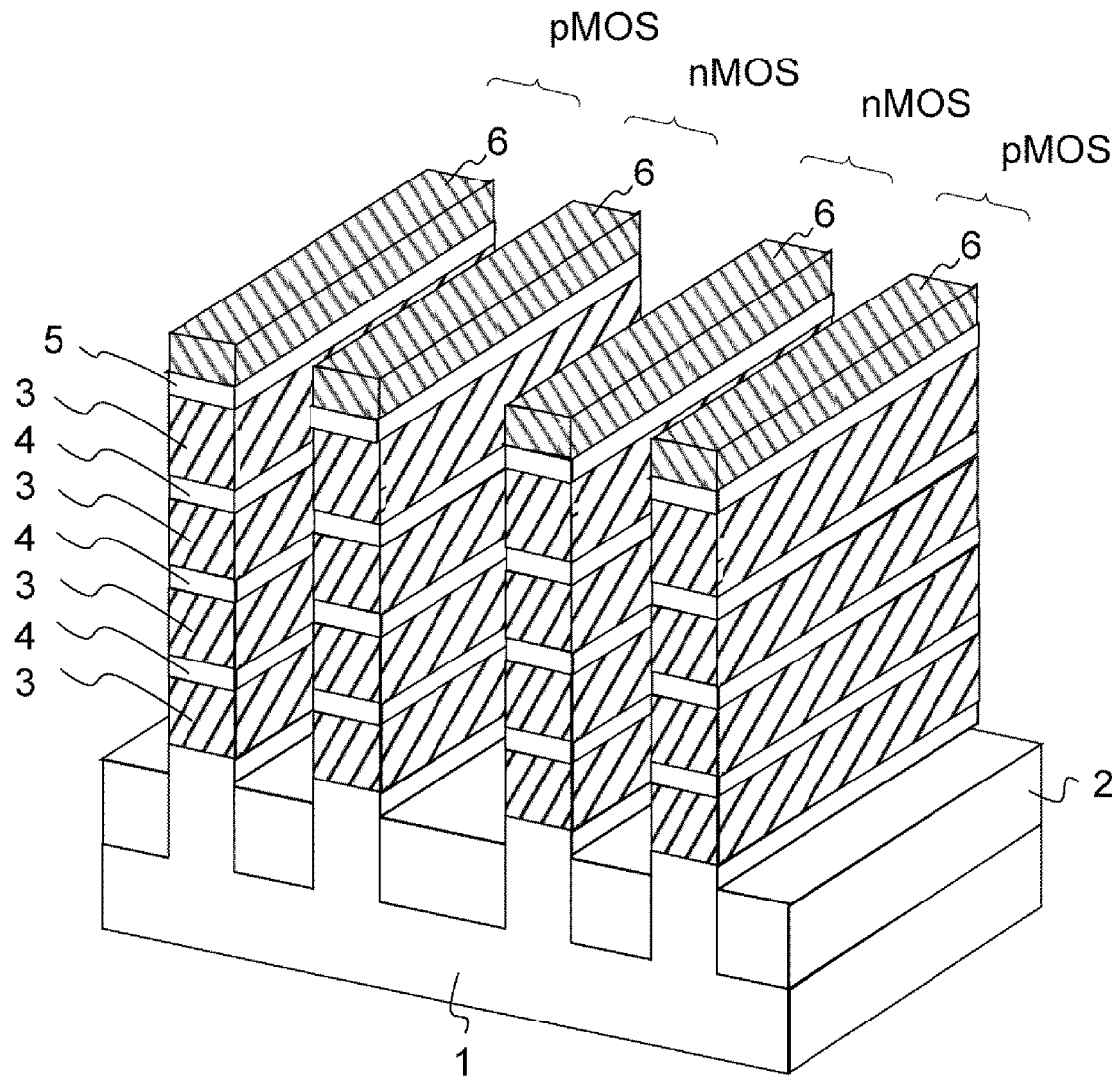

[FIG. 2B]
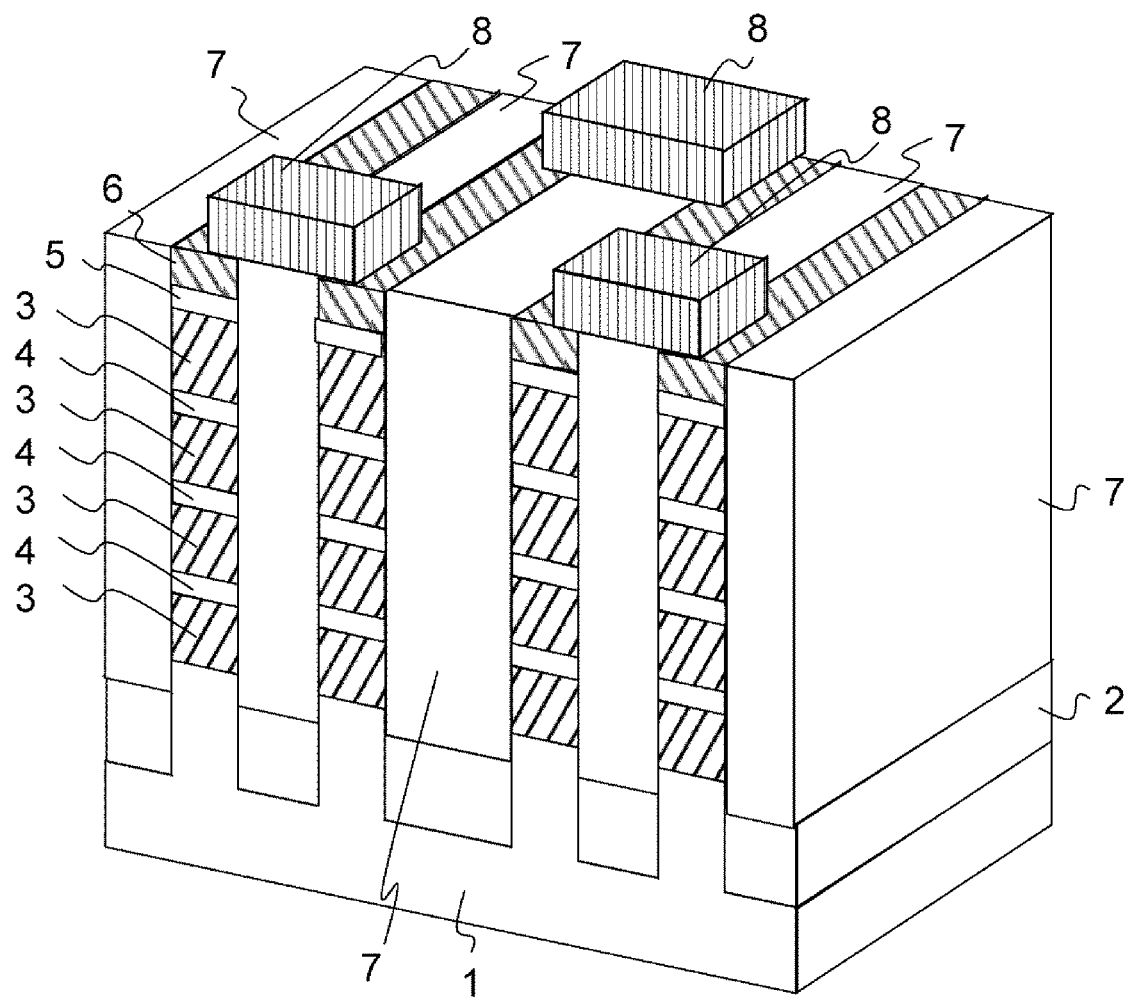

[FIG. 2C]
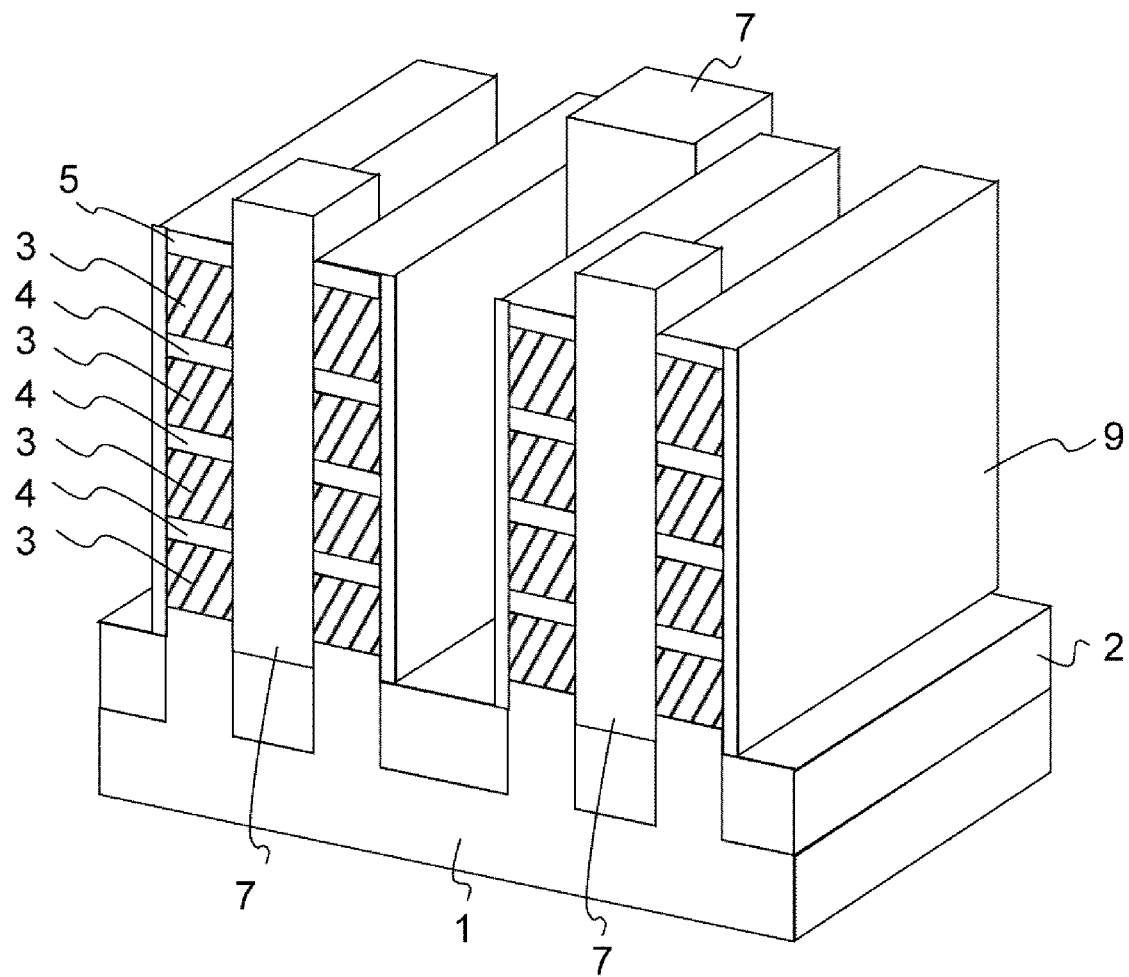

[FIG. 2D]
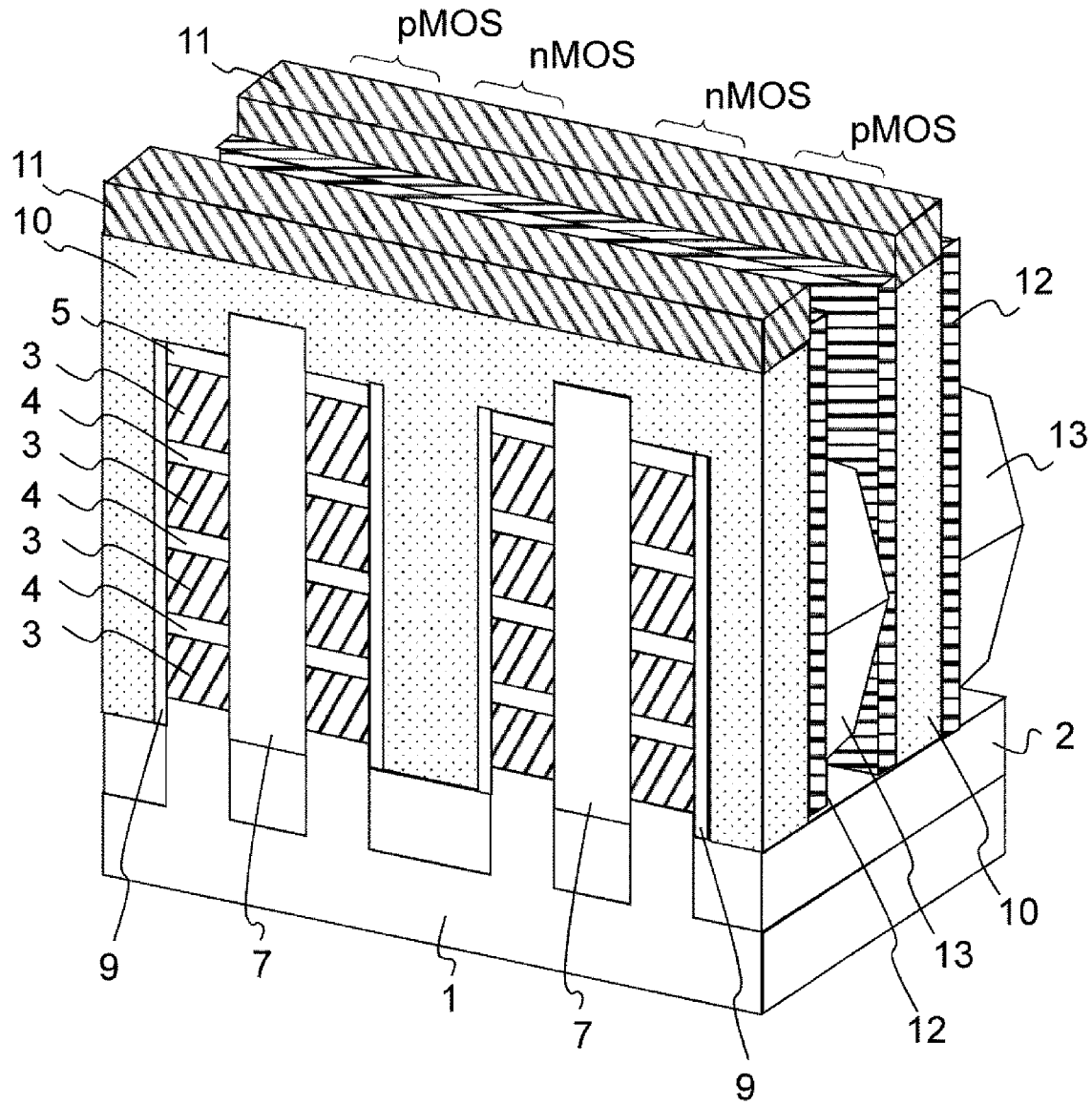

[FIG. 2E]
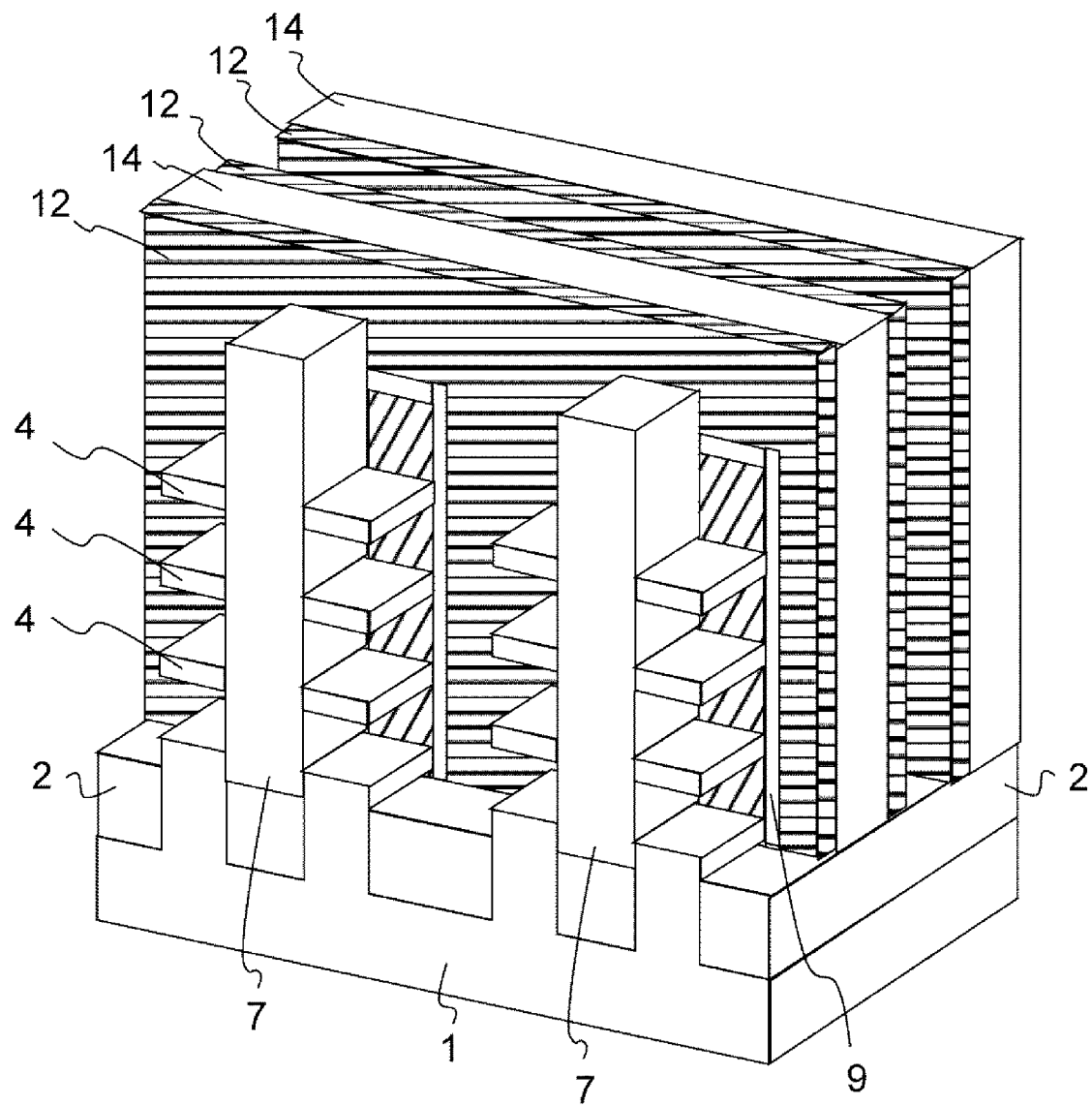

[FIG. 3]
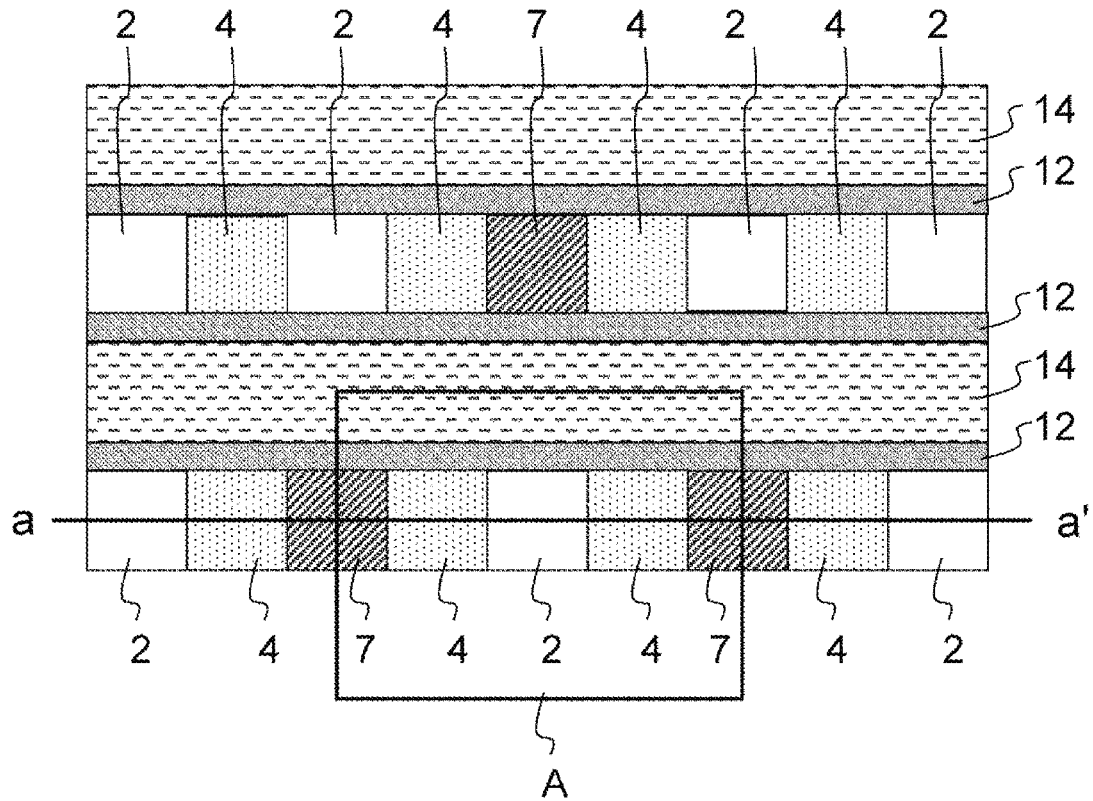
[FIG. 4]
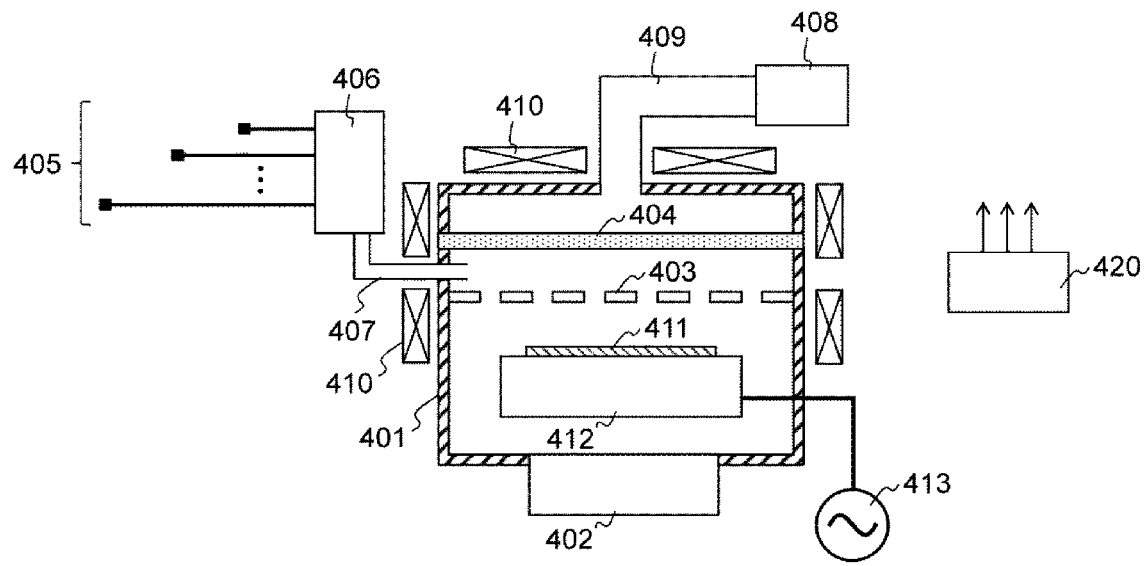

[FIG. 5]
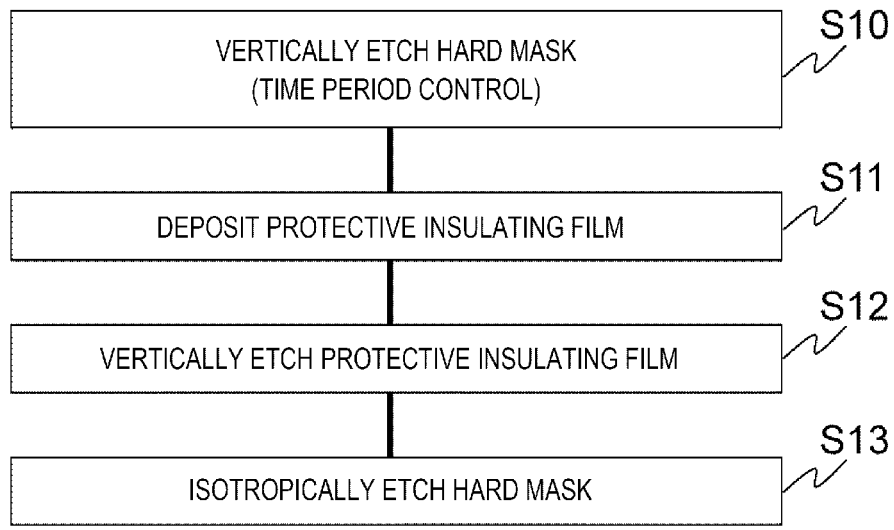
[FIG. 6A]
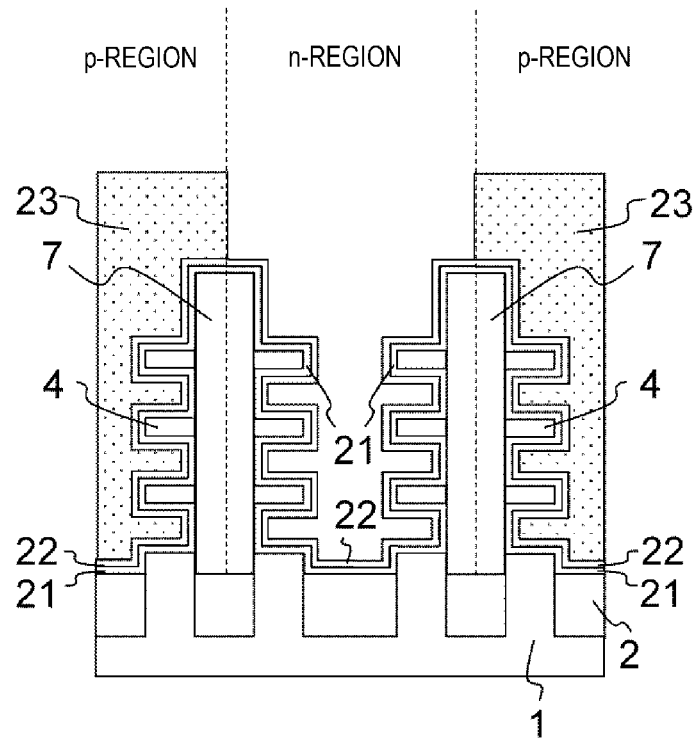

[FIG. 6B]
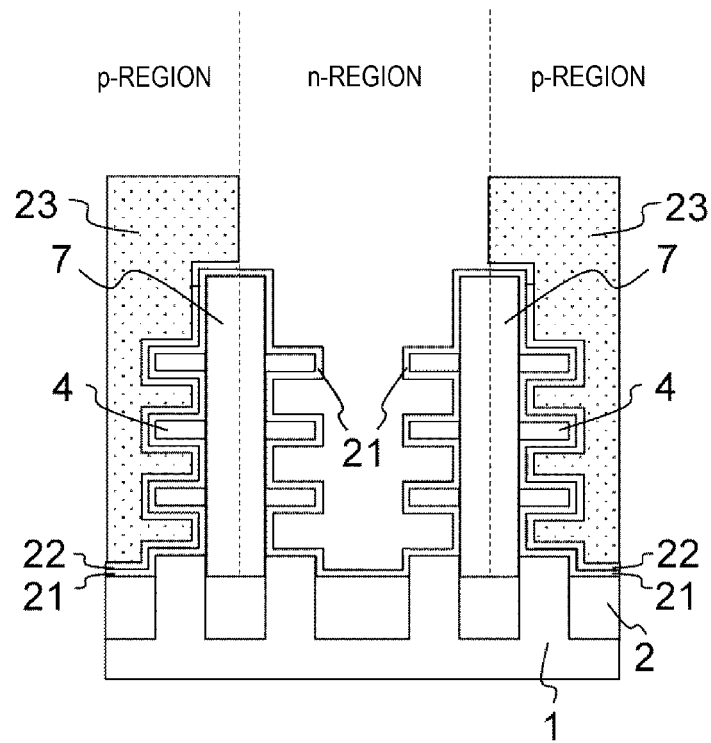
[FIG. 6C]
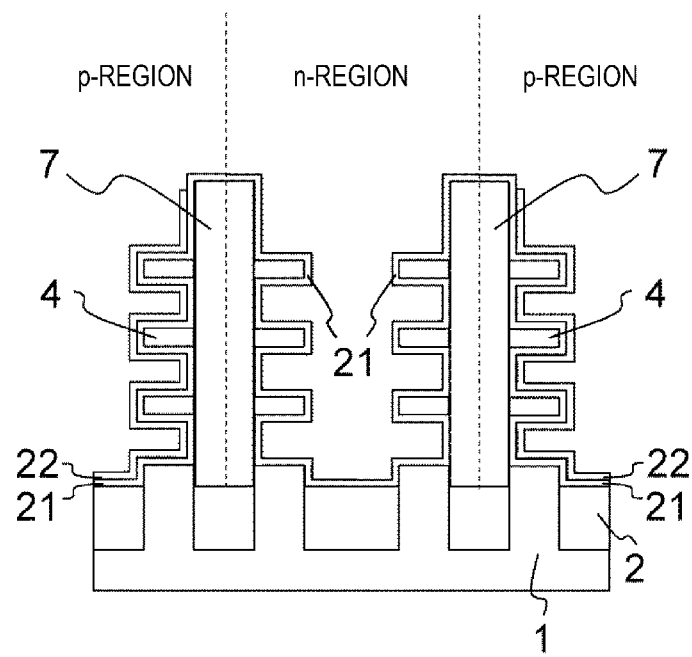

[FIG. 6D]
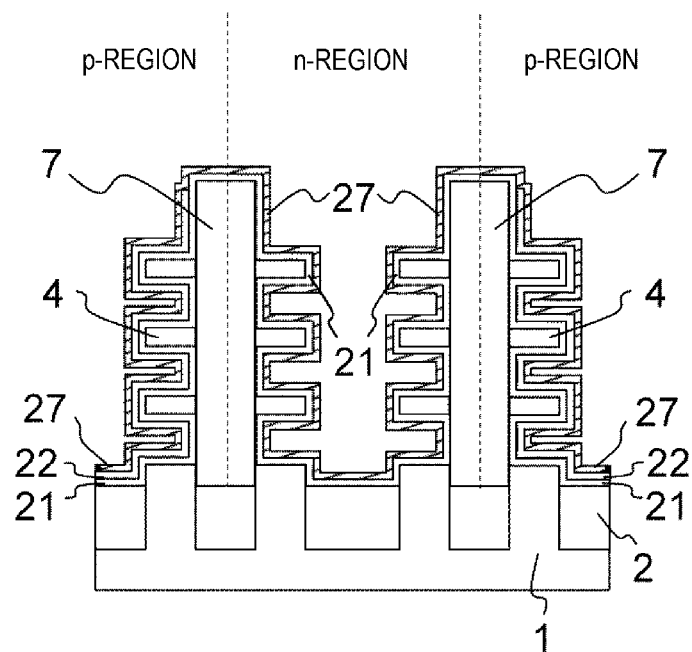
[FIG. 6E]
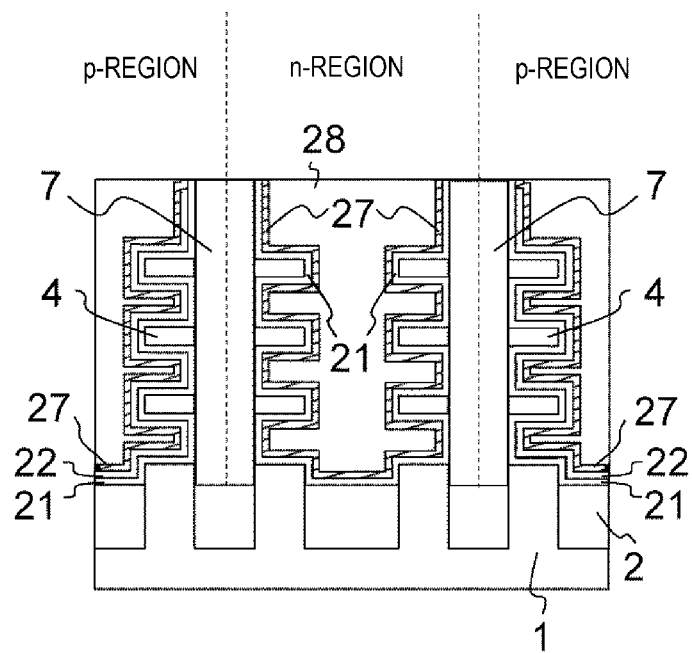

[FIG. 7A]
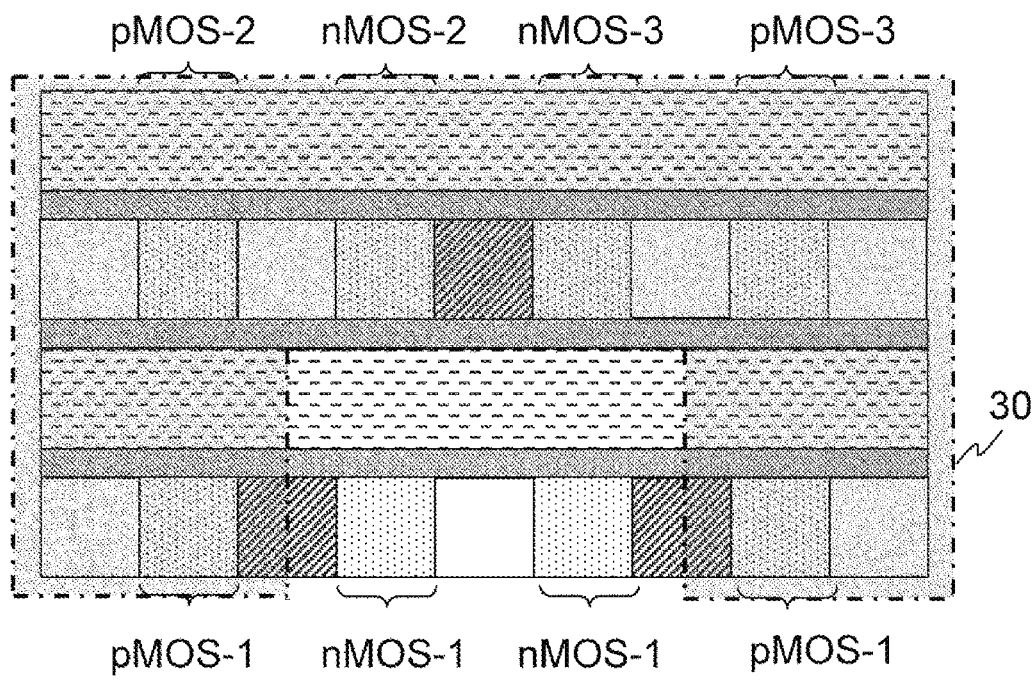
[FIG. 7B]
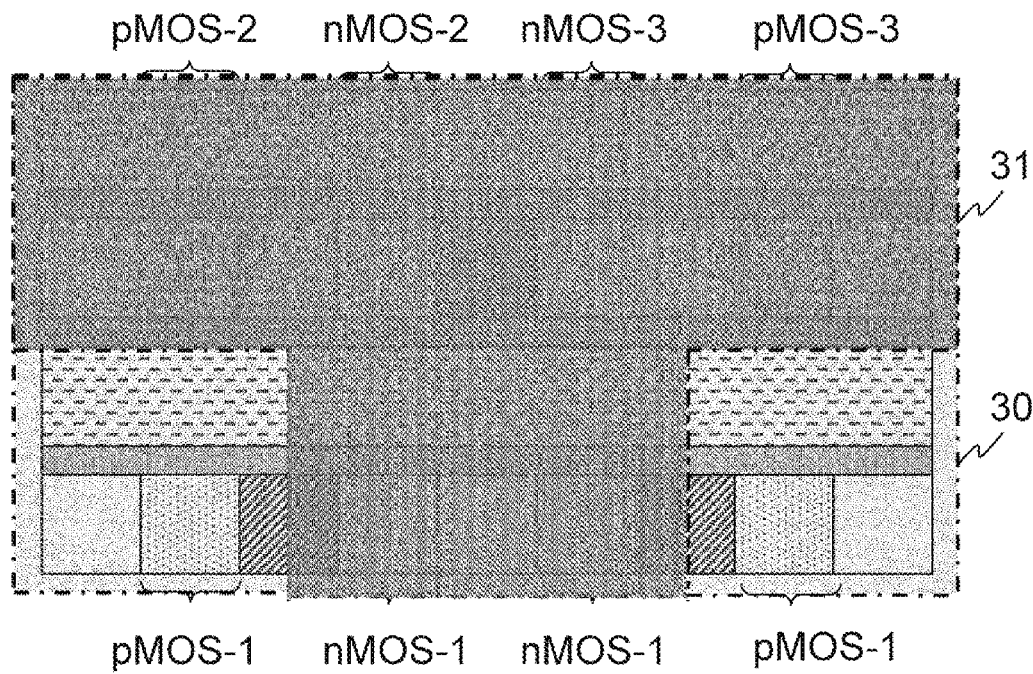

[FIG. 7C]
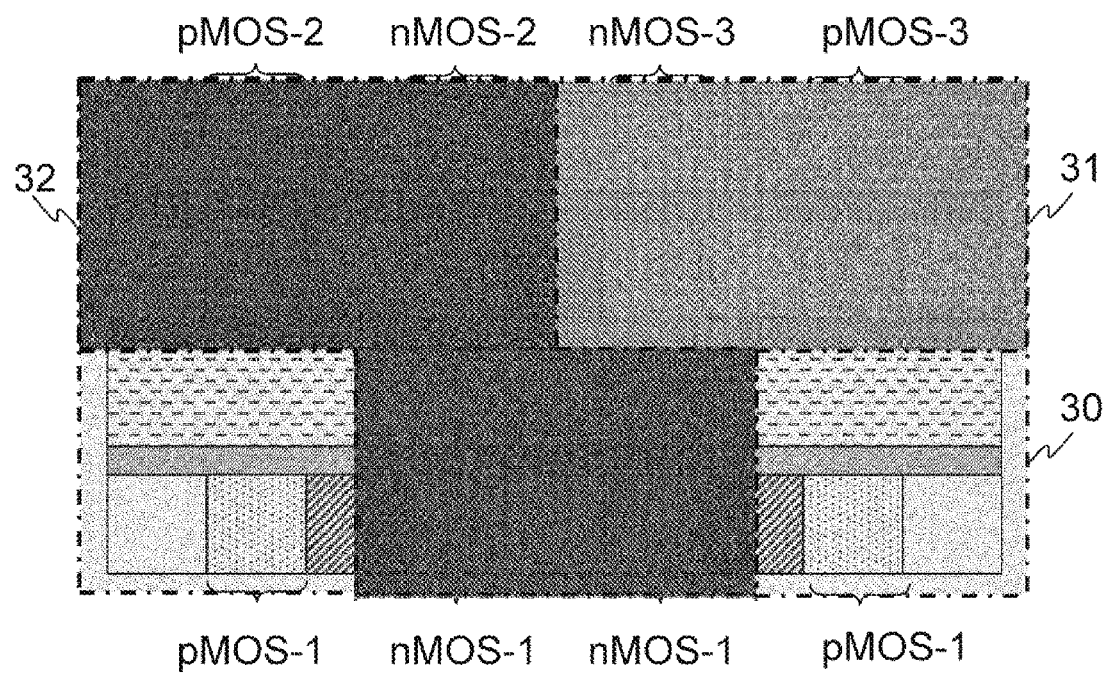
[FIG. 7D]
| MOSFET | nMOS-1 | nMOS-2 | nMOS-3 | pMOS-1 | pMOS-2 | pMOS-3 |
|---|---|---|---|---|---|---|
| WFM STACKED FILM | n-WFM-2 n-WFM-1 | n-WFM-2 n-WFM-1 p-WFM-1 | n-WFM-1 p-WFM-1 | p-WFM-1 | n-WFM-2 n-WFM-1 p-WFM-1 | n-WFM-1 p-WFM-1 |

[FIG. 8A]
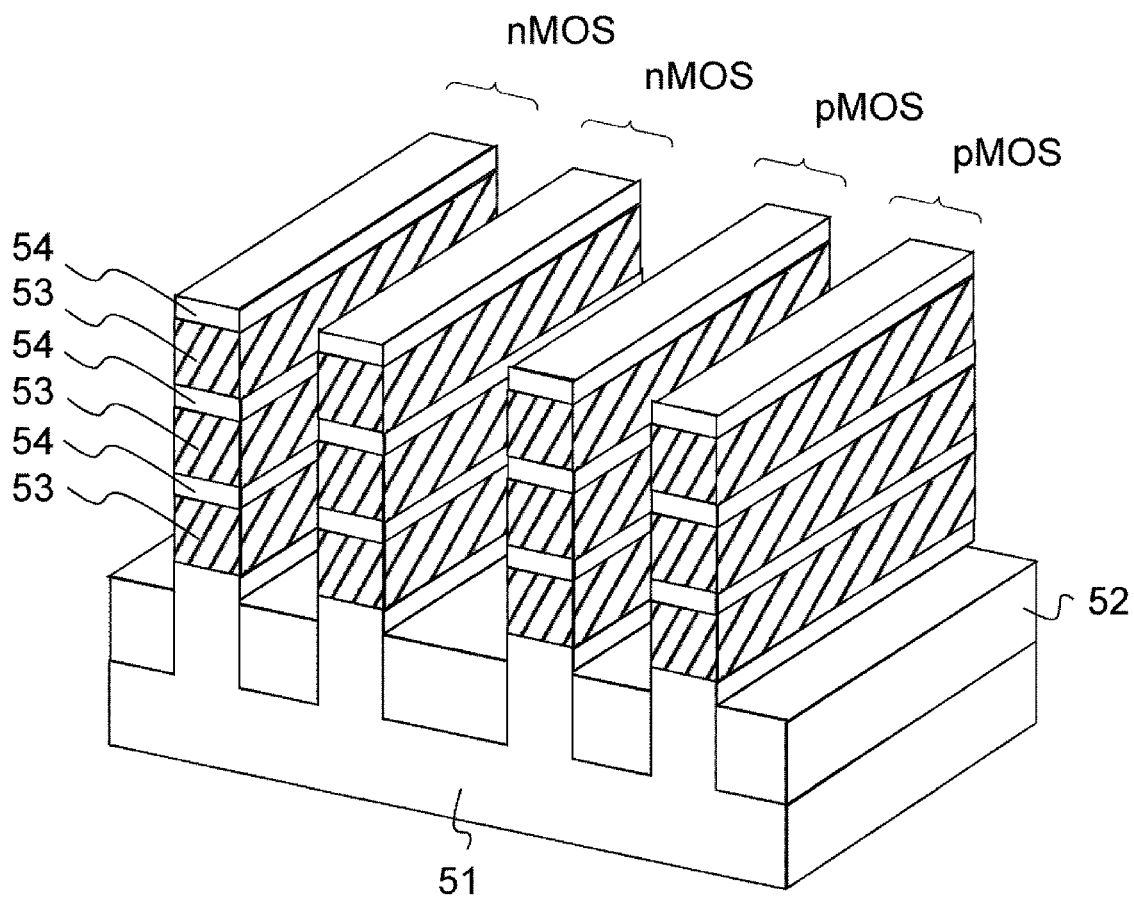

[FIG. 8B]
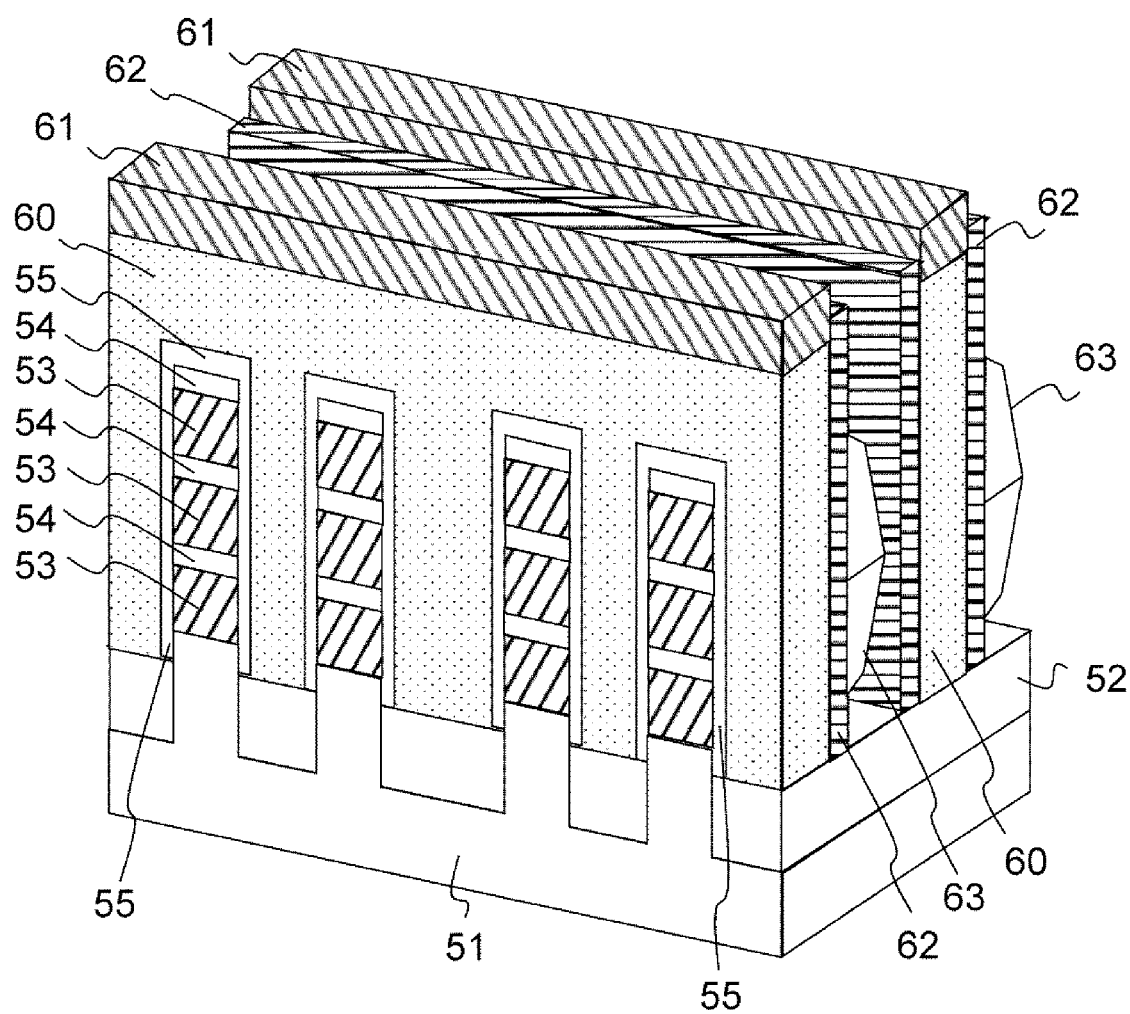

[FIG. 8C]
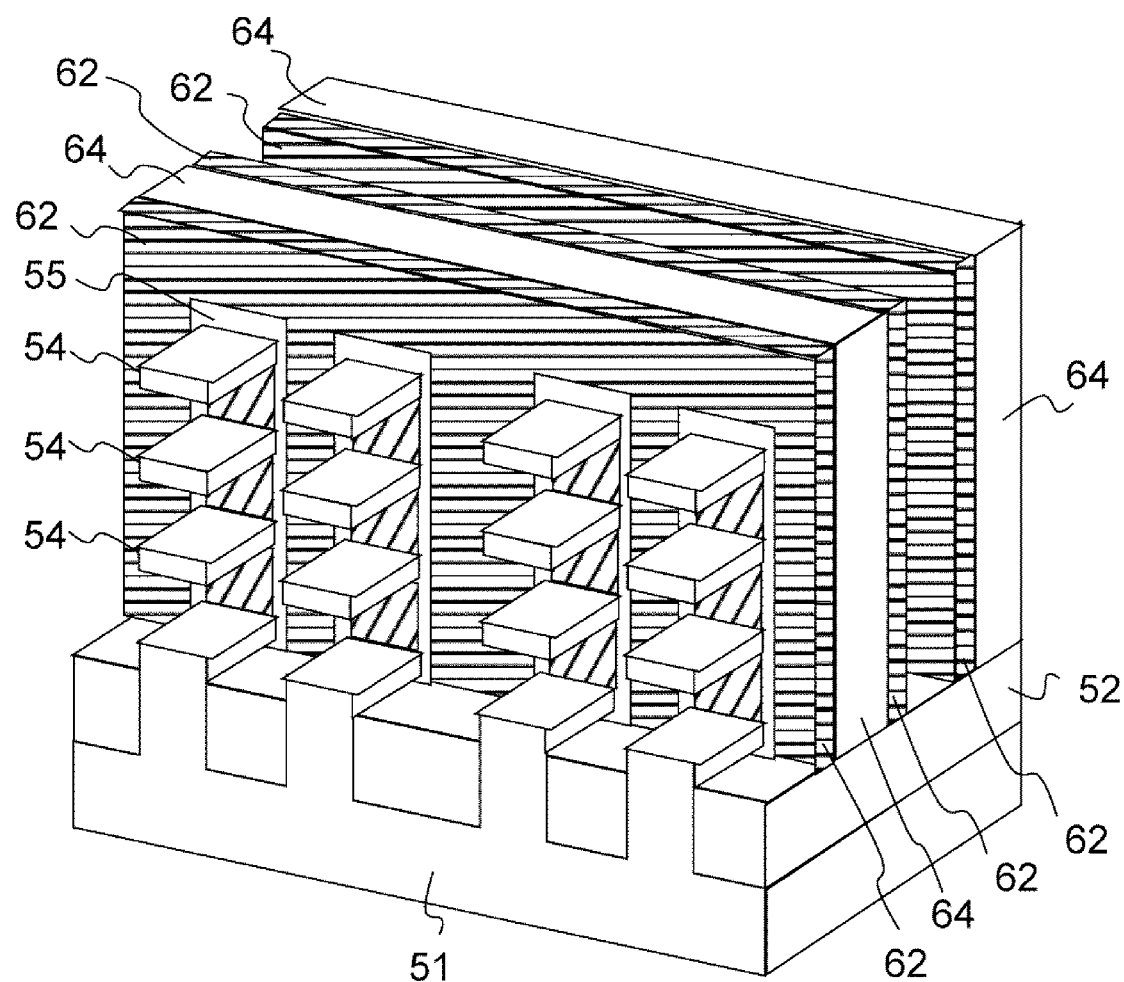

[FIG. 9A]
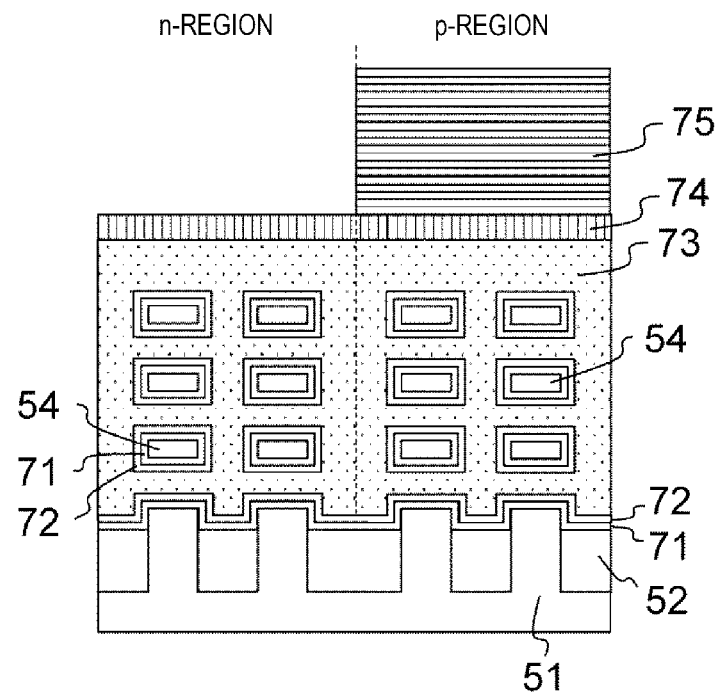
[FIG. 9B]
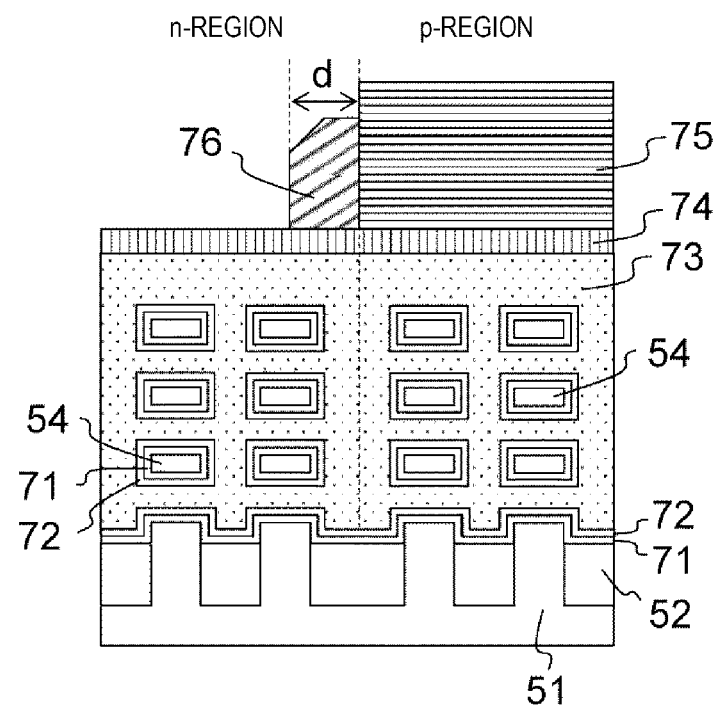

[FIG. 9C]
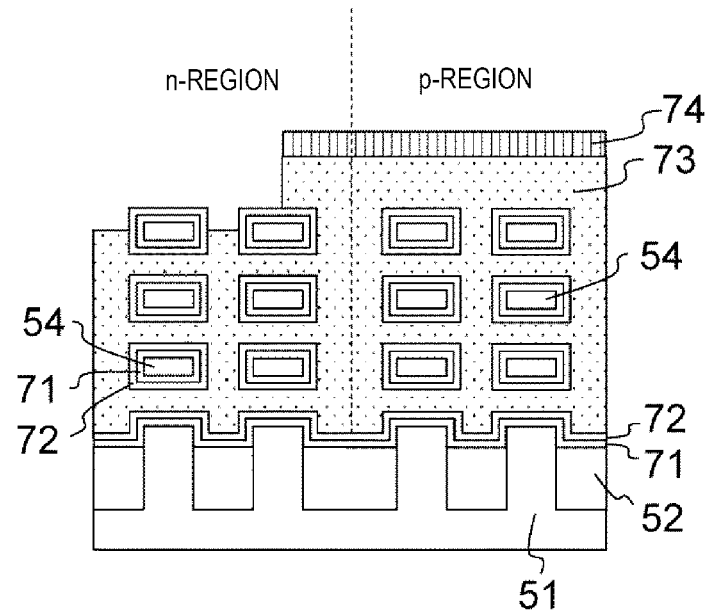
[FIG. 9D]
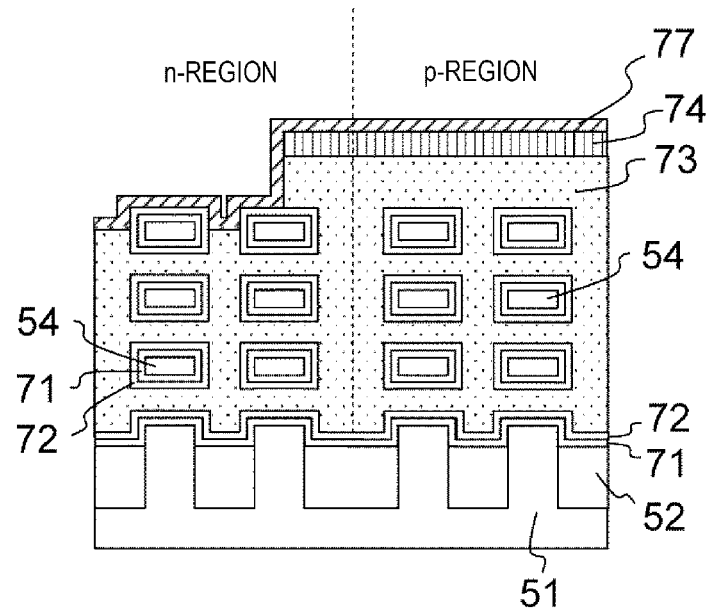

[FIG. 9E]
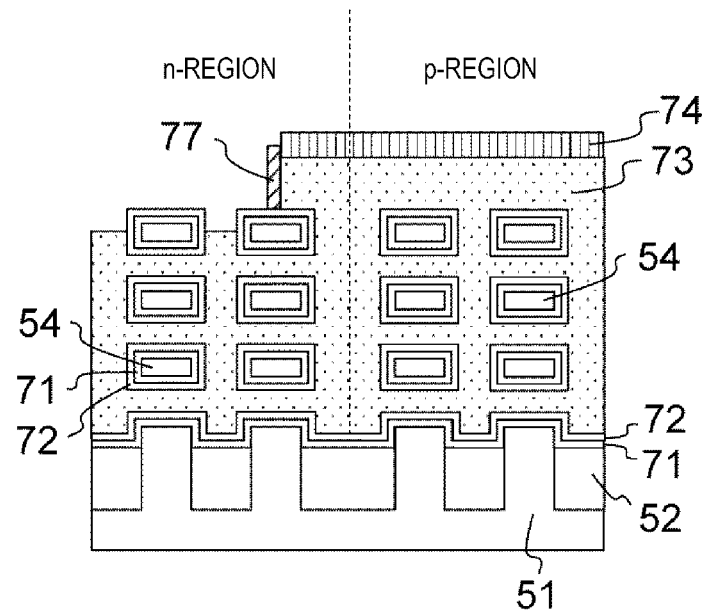
[FIG. 9F]
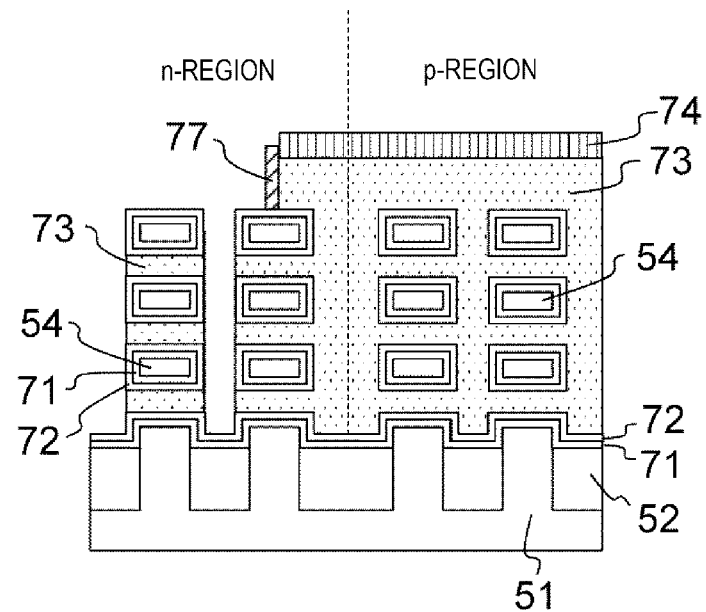

[FIG. 9G]
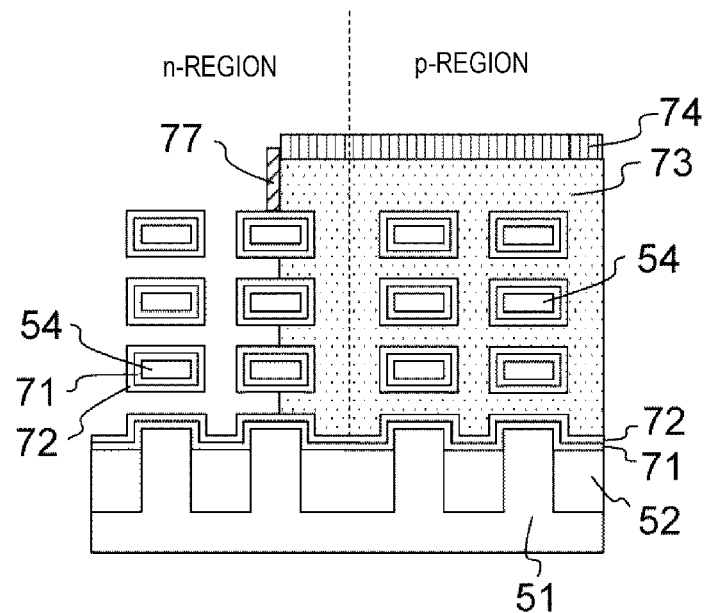
[FIG. 9H]
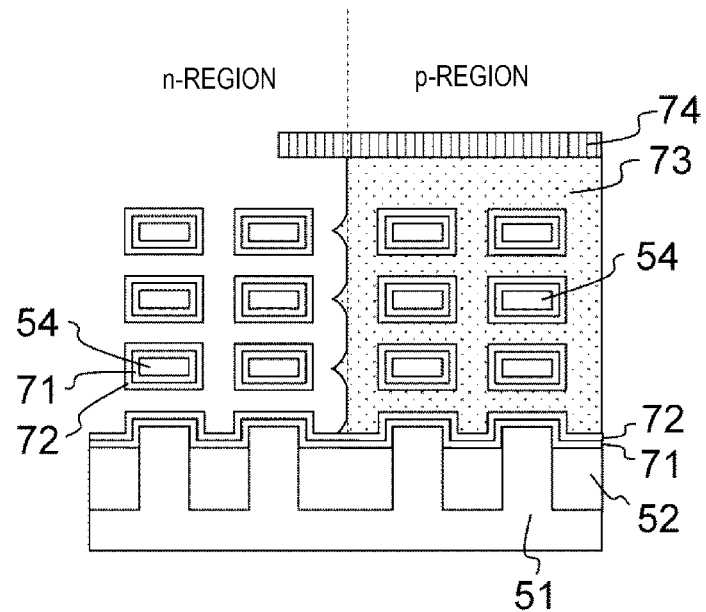

[FIG. 10]
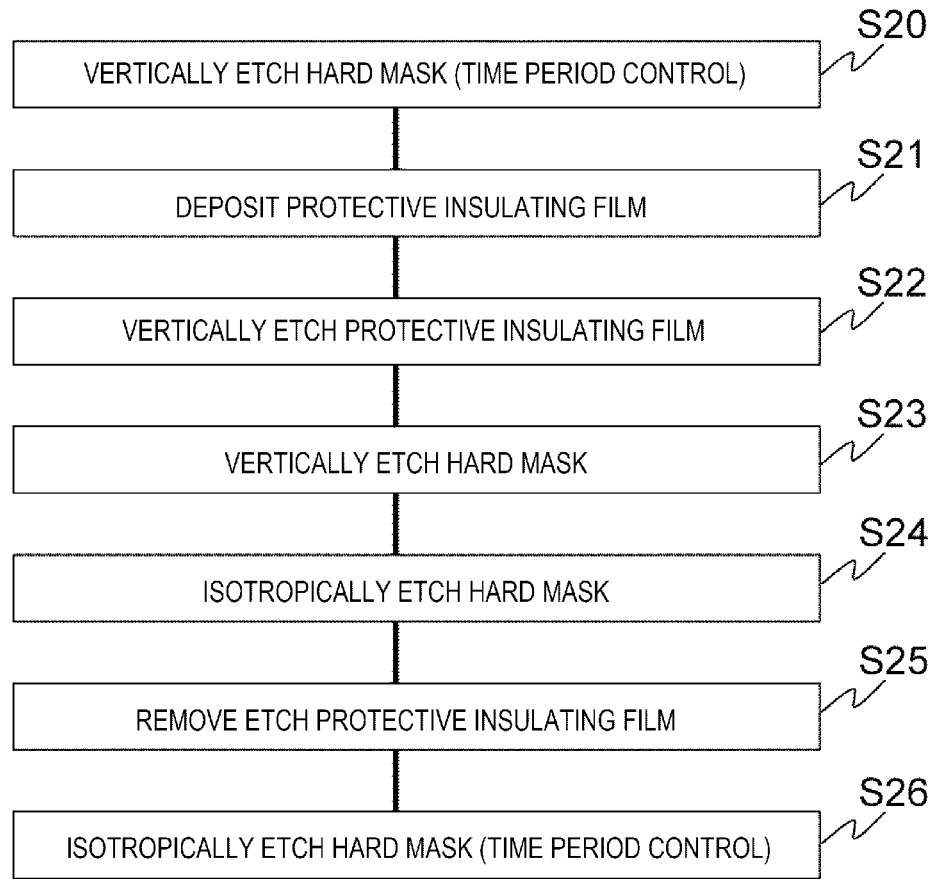
[FIG. 11A]
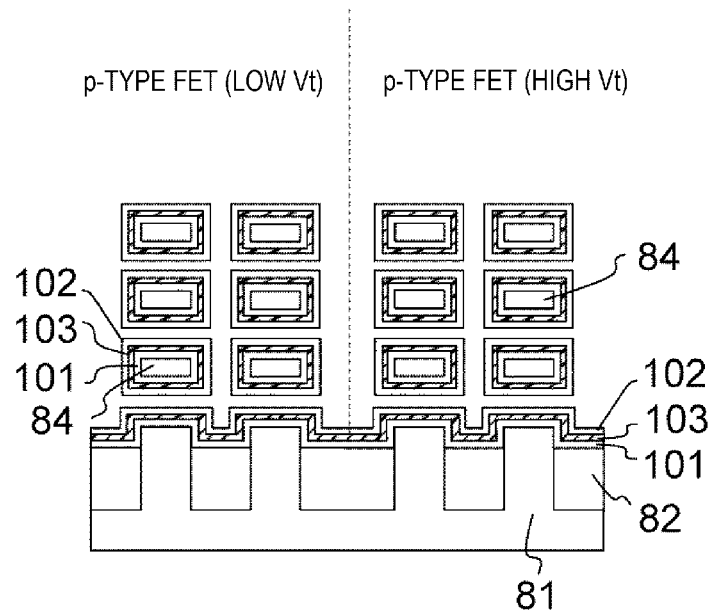

[FIG. 11B]
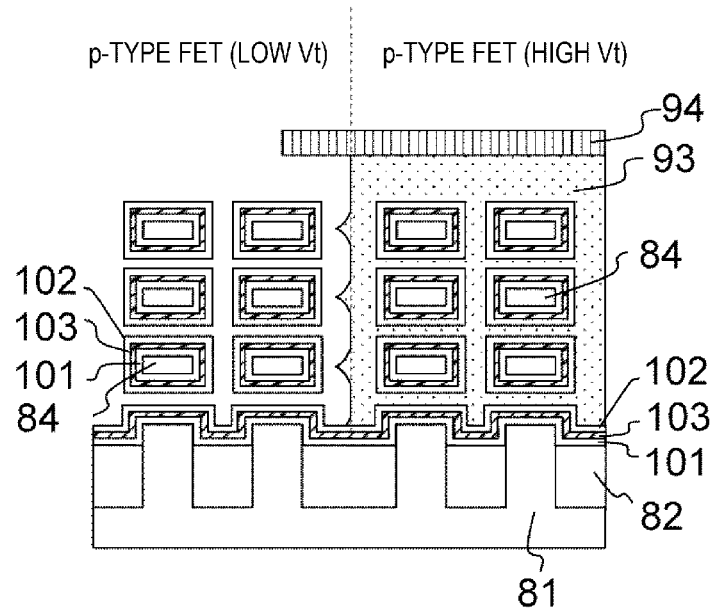
[FIG. 11C]
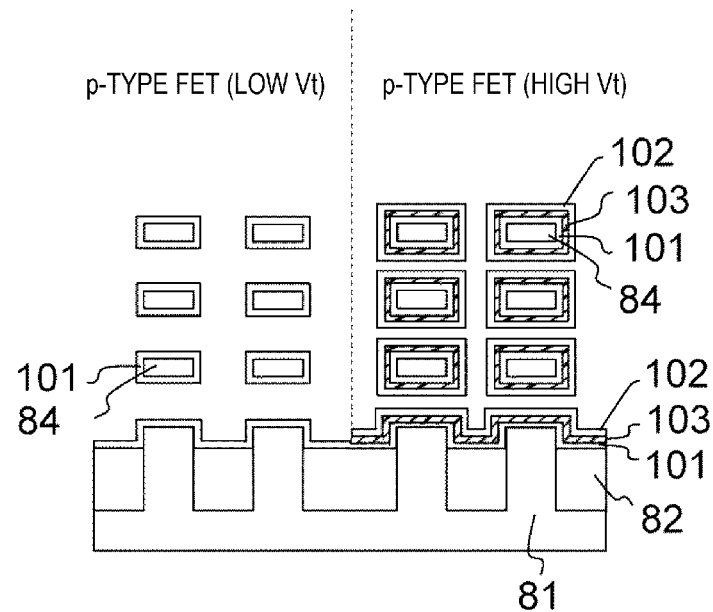

[FIG. 11D]
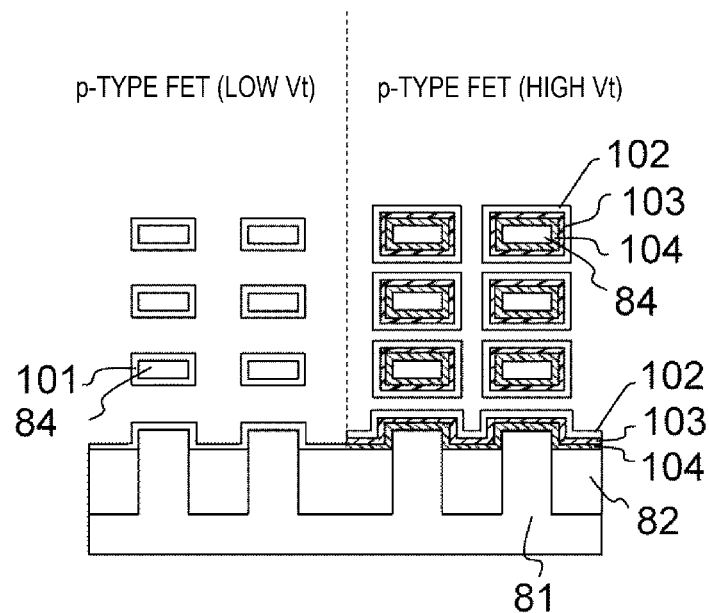
[FIG. 11E]
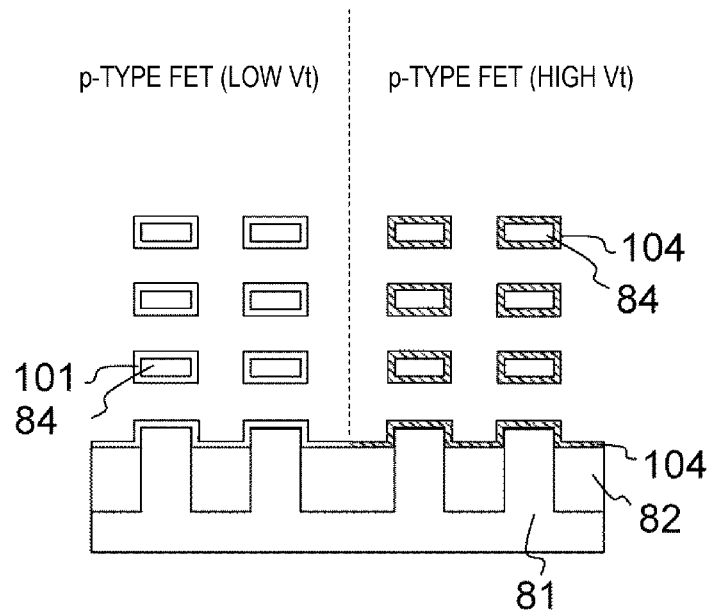

MANUFACTURING METHOD OF THREE-DIMENSIONAL SEMICONDUCTOR DEVICE

TECHNICAL FIELD

The present invention relates to a manufacturing method of a semiconductor device and a plasma processing apparatus.

BACKGROUND ART

Miniaturization of transistors is essential for continuously improving function and performance of an integrated circuit chip. In order to achieve the miniaturization of the transistors, various studies have been performed on structures and materials of elements for improving the performance of miniaturized transistors. Examples of the studies include introducing a strain to a source/drain region, introducing a high dielectric gate insulating film and a metal, introducing a new structure such as a fin type in a metal oxide semiconductor field effect transistor (MOSFET), and the like.

In a fin type FET, gate controllability can be improved and a short channel effect (that is, increase in leak current) due to a reduction of a gate length accompanying miniaturization of the transistor can be prevented by covering a periphery of a fin type channel having a three-dimensional structure with a gate. Further, as the miniaturization develops, a gate all around type FET (GAA) is expected in which a channel is a wire shaped or sheet shaped stacked body and a periphery of the channel is covered with a gate. In the GAA type FET, the gate controllability can be further improved and the short channel effect can be further prevented as compared with the fin type FET by covering an entire periphery of a wire shaped or a sheet shaped channel (nanowire channel/nanosheet channel) with a gate.

In both of the fin type FET and the GAA type FET, a gate insulating film, a work function control metal, and a low resistance gate metal are stacked on the channel of the FET. Among these, since the work function control metal determines a threshold voltage for the FET to be in an operating state, it is necessary to use an appropriate metal material in accordance with a type and application of the FET. Therefore, in a manufacturing process of the FET, it is necessary to replace the work function control metal for each type of FET, and thus the manufacturing process is complicated and the miniaturization of the transistor is limited.

PTL 1 relates to a fin type FET and discloses a method of patterning by covering a fin on which a first work function control metal is stacked with a mask material, exposing a specific fin and removing the first work function control metal, and then stacking a second work function control metal.

PTL 2 relates to a GAA type FET and discloses a GAA type FET in which a gate insulating film and a work function control metal are buried between stacked channels.

Non-PTL 1 proposes a structure (referred to as stacked nanosheet fork structure) in which an insulating film is buried between a pair of nanosheet channels arranged in a horizontal direction and no work function control metal is added between nanosheet channels and the insulating film. It is advantageous for the miniaturization since the gap between the nanosheet channels isolated by the insulating film can be shortened.

CITATION LIST

Patent Literature

PTL 1: WO 2013/101007
PTL 2: US Patent Application Publication 2018/0308768 Specification Non-PTL 1: P. Weckx et al., "Stacked nanosheet fork architecture for SRAM design and device co-optimization toward 3 nm", proceedings of IEDM 2017, 2017, pp. 505-508

SUMMARY OF INVENTION

Technical Problem

When the method of replacing the work function control metal disclosed in PTL 1 is applied to the GAA type FET, it is necessary to remove the mask material between the stacked nanowire or nanosheet type channels since the work function control metal is stacked on an entire circumference of the channel in the structure of the GAA type FET. Therefore, as compared with the fin type FET, an etching amount of the mask material in a horizontal direction is increased and if a distance between FETs for replacing the work function control metal is not widened, the mask material covering the channels that must not be removed may be removed.

The structure disclosed in Non-PTL 1 has a similar problem. When one of the nanosheet channels isolated by the insulating film is a p-type channel and the other is an n-type channel, it is necessary for work function control metals to be replaced at one of the channels since a work function control metal for a p-type FET and a work function control metal for an n-type FET are stacked on respective channels. Although details of a process are not described in Non-PTL 1, for a device in which the n-type channel and the p-type channel isolated by the insulating film are formed, in a process of removing a mask material between the stacked n-type channels, for example, a mask material between the stacked p-type channels may also be removed at the same time.

In contrast, in a structure of the GAA type FET disclosed in PTL 2, no mask material exists between the stacked nanowire or nanosheet type channels. Therefore, the above problem can be avoided. However, the work function control metal requires a certain degree of film thickness in order to bury the work function control metal between the stacked nanowire or nanosheet channels. Therefore, there is a possibility that the gate cannot be completely buried with the work function control metal when the gate length is reduced due to the miniaturization. Since the low resistance gate metal cannot be buried between the stacked nanowire or nanosheet channels, there is a concern that a gate resistance increases.

The invention provides a manufacturing process of a three-dimensional structure device such as a GAA type FET or a fork type FET having stacked channels in which channels having a shape of a wire or a sheet are stacked in a direction vertical to a substrate, in which a work function control metal can be separately formed without expanding a space between FETs having different threshold voltages, and provides a plasma processing apparatus that can continuously and separately forming the work function control metal in the same apparatus.

Solution to Problem

The invention provides a manufacturing method of a semiconductor device including a first step of performing anisotropic etching to open the mask material until the work function control metal film is exposed; a second step of depositing a protective film; a third step of performing anisotropic etching to remove the protective film while remaining the protective film deposited on sidewalls of the mask material opened in the first step; and a fourth step of performing isotropic etching to selectively remove the mask material between the channels relative to the protective film and the work function control metal film, and provides a plasma processing apparatus that is able to continuously execute the above steps.

Advantageous Effect

A manufacturing process of a three-dimensional structure device such as a GAA type FET or a fork type FET having stacked channels in which channels having a shape of a wire or a sheet are stacked in a direction vertical to a substrate, in which a work function control metal can be separately formed without expanding a horizontal space between FETs having different threshold voltages.

Other problems and novel features will be apparent from a description of the description and accompanying drawings.

BRIEF DESCRIPTION OF DRAWINGS

FIG. 1A is a cross-sectional view showing a process of removing a mask material between stacked channels according to a first embodiment.

FIG. 1B is a cross-sectional view showing the process of removing the mask material between the stacked channels according to the first embodiment.

FIG. 1C is a cross-sectional view showing the process of removing the mask material between the stacked channels according to the first embodiment.

FIG. 1D is a cross-sectional view showing the process of removing the mask material between the stacked channels according to the first embodiment.

FIG. 1E is a cross-sectional view showing the process of removing the mask material between the stacked channels according to the first embodiment.

FIG. 2A is a bird's eye view showing a channel forming process of a nanosheet fork type FET.

FIG. 2B is a bird's eye view showing the channel forming process of the nanosheet fork type FET.

FIG. 2C is a bird's eye view showing the channel forming process of the nanosheet fork type FET.

FIG. 2D is a bird's eye view showing the channel forming process of the nanosheet fork type FET.

FIG. 2E is a bird's eye view showing the channel forming process of the nanosheet fork type FET.

FIG. 3 is a plan view of a structure in FIG. 2E as viewed from above.

FIG. 4 shows a configuration example of a plasma processing apparatus.

FIG. 5 is a flow diagram showing the process of removing the mask material between the stacked channels according to the first embodiment.

FIG. 6A is a cross-sectional view showing a work function control metal replacement process according to the first embodiment.

FIG. 6B is a cross-sectional view showing the work function control metal replacement process according to the first embodiment.

FIG. 6C is a cross-sectional view showing the work function control metal replacement process according to the first embodiment.

FIG. 6D is a cross-sectional view showing the work function control metal replacement process according to the first embodiment.

FIG. 6E is a cross-sectional view showing a metal buried layer forming process according to the first embodiment.

FIG. 7A is a plan view showing a work function control metal replacement process according to a second embodiment.

FIG. 7B is a plan view showing the work function control metal replacement process according to the second embodiment.

FIG. 7C is a plan view showing the work function control metal replacement process according to the second embodiment.

FIG. 7D is a view showing a work function control metal stacked film stacked on each MOSFET.

FIG. 8A is a bird's eye view showing a channel forming process of a GAA type FET.

FIG. 8B is a bird's eye view showing the channel forming process of the GAA type FET.

FIG. 8C is a bird's eye view showing the channel forming process of the GAA type FET.

FIG. 9A is a cross-sectional view showing a process of removing a mask material between stacked channels according to a third embodiment.

FIG. 9B is a cross-sectional view showing the process of removing the mask material between the stacked channels according to the third embodiment.

FIG. 9C is a cross-sectional view showing the process of removing the mask material between the stacked channels according to the third embodiment.

FIG. 9D is a cross-sectional view showing the process of removing the mask material between the stacked channels according to the third embodiment.

FIG. 9E is a cross-sectional view showing the process of removing the mask material between the stacked channels according to the third embodiment.

FIG. 9F is a cross-sectional view showing the process of removing the mask material between the stacked channels according to the third embodiment.

FIG. 9G is a cross-sectional view showing the process of removing the mask material between the stacked channels according to the third embodiment.

FIG. 9H is a cross-sectional view showing the process of removing the mask material between the stacked channels according to the third embodiment.

FIG. 10 is a flow diagram showing the process of removing the mask material between the stacked channels according to the third embodiment.

FIG. 11A is a cross-sectional view showing a gate insulating film separately forming process according to a fourth embodiment.

FIG. 11B is a cross-sectional view showing the gate insulating film separately forming process according to the fourth embodiment.

FIG. 11C is a cross-sectional view showing the gate insulating film separately forming process according to the fourth embodiment.

FIG. 11D is a cross-sectional view showing the gate insulating film separately forming process according to the fourth embodiment.

FIG. 11E is a cross-sectional view showing the gate insulating film separately forming process according to the fourth embodiment.

DESCRIPTION OF EMBODIMENTS

Embodiments of the invention will be described below with reference to drawings. The invention is not limited to the embodiments described below, and various modifications can be made within the scope of the technical idea thereof. In all the drawings showing the embodiments, members having the same function are denoted by the same reference numerals, and repetitive descriptions thereof are omitted. Many modifications can be made, for example, changing a combination of a material and a manufacturing process relating to the contents disclosed in the present embodiment, which is needless to say. The drawings are not necessarily to scale, and are schematically drawn with an emphasis being placed on main parts in order to clarify a logic.

First Embodiment

In the first embodiment, a process of separately forming a work function control metal film on a stacked nanowire channel or a stacked nanosheet channel in a device having a fork type FET will be described. First, a channel forming process of the fork type FET with nanowire or nanosheet channels will be described with reference to FIGS. 2A to 2E.

In FIG. 2A, stacked films of single crystal silicon germanium (SiGe) layers 3 and single crystal silicon (Si) layers 4 are formed on a single crystal silicon (Si) substrate 1, and a thin insulating film 5 and a hard mask 6 are formed on an uppermost SiGe layer 3. The stacked films of the SiGe layers 3 and the Si layers 4 are formed by epitaxial growth using chemical vapor deposition (CVD) or the like, and a composition of germanium (Ge) in the SiGe layer 3 may be 15 to 40%. The SiGe layers 3 are grown so as to fit their lattice to that of the Si substrate 1, and strain energy caused by a difference in a lattice constant between SiGe and Si is contained inside SiGe. The stacked films of the SiGe layers 3 and the Si layers 4 are alternately stacked repeatedly. It is necessary for the number of the repeatedly stacked SiGe layers 3 and the Si layers 4 and a film thickness of each layer to be adjusted under a condition that the strain energy contained in the SiGe layer does not exceed a critical film thickness at which a defect occurs in the SiGe layer 3, along with characteristics required for the FET. A desired film thickness of the SiGe layer 3 which is a sacrificial layer is about 8 to 20 nm, and a desired film thickness of the Si layer 4 which is a channel of the FET is about 5 to 10 nm. The number of the repeatedly stacked SiGe layers 3 and the Si layers 4 may be 3 to 6, respectively. The epitaxial growth by the CVD method is performed using, for example, monosilane ($SiH_4$), disilane ($Si_2H_6$), germane ($GeH_4$), or the like, which were diluted with hydrogen in a source gas. The thin insulating film 5 formed on the uppermost SiGe layer 3 may be an insulating film such as a silicon oxide film ($SiO_2$), or a silicon oxynitride film (SiON) and a silicon carbon oxide film (SiCO) derived therefrom, and is formed by the CVD method or the like or by oxidizing the SiGe layer 3 in an oxygen atmosphere. A film thickness of the thin insulating film 5 is about 2 to 4 nm. The hard mask 6 on the thin insulating film 5 is a silicon nitride film ($Si_3N_4$), a SiON film or a SiCO film derived therefrom, or a silicon oxycarbonitride film (SiOCN film) formed by the CVD method or the like. A film thickness of the hard mask 6 is about 20 to 100 nm.

The hard mask 6 is processed into a linear pattern. A pattern width may be adjusted to about 5 to 15 nm when a narrow line shaped nanowire channel is formed, and may be adjusted to about 10 to 50 nm when a sheet shaped nanosheet channel is formed. In the nanowire channel, since a peripheral length of the channel which is equivalent to channel width is short, controllability by a gate is increased while a value of a driving current is small. On the other hand, in the nanosheet channel, although controllability by a gate is slightly worse than that of the nanowire, a large driving current can be obtained. A channel shape is determined in view of a required device application. The linear pattern is a periodic pattern or a pattern based thereon. For example, when a laser using an argon fluoride gas (ArF) as a light source is used, self-aligned double patterning (SADP) can be used if a pattern period is equal to or more than 40 nm and equal to or less than 80 nm, and self-aligned quadruple patterning (SAQP) can be used if the pattern period is equal to or more than 20 nm and equal to or less than 40 nm. When exposure to extreme ultraviolet (EUV) having a wavelength of 13.5 nm is performed, single exposure (single patterning) can be used for a pattern period is equal to or larger than 40 nm, and SADP can be used if the pattern period is equal to or more than 20 nm and equal to or less than 40 nm. The hard mask 6 is set as a mask, and the thin insulating film 5, the stacked films of the SiGe layers 3 and the Si layers 4, and a part of the Si substrate 1 are etched by vertical etching using plasma. Thereafter, an insulating film 2 that forms an isolation region (shallow trench isolation: STI) for FETs is deposited in grooves of the partially patterned Si substrate 1. The STI insulating film 2 is then etched back to obtain a structure in FIG. 2A. The STI insulating film 2 is formed by using CVD or the like. A material of the STI insulating film 2 may be $SiO_2$, or SiON, SiCO or the like derived from $SiO_2$.

Subsequently, FET isolation insulating films 7 that insulate two neighboring FETs are deposited by the CVD method or the like to cover the pattern structure in FIG. 2A, and surfaces thereof are flattened by chemical mechanical polishing (CMP). Next, resists 8 are deposited on regions where the neighboring FETs are insulated by the insulating films 7, and the resists 8 are patterned to obtain a structure shown in FIG. 2B. Here, the resist 8 may be a tri-layer resist including a spin-on-carbon film, a spin-on-glass film and an organic resist. Here, the spin-on-carbon film is an organic film mainly containing carbon, and the spin-on-glass film is an organic film containing Si and oxygen. Generally, in a process using a tri-layer resist, in many cases, the spin-on-glass film is etched using a resist, the spin-on-carbon film is etched using the spin-on-glass film as a mask, and then the resist and the spin-on-glass film are removed and the spin-on-carbon film is used as a mask. In this case, the resist 8 mainly includes a spin-on-carbon film.

Thereafter, vertical etching is performed to the FET isolation insulating films 7 using the resists 8 as masks. Then, asking is performed under an oxygen plasma atmosphere to remove the resists 8. Further, dry etching or wet etching by using phosphoric acid and the like is performed to remove the hard mask 6. Further, a dummy gate insulating film 9 is formed on sidewalls of the SiGe layers 3 and the Si layers 4 to obtain a structure in FIG. 2C. The dummy gate insulating film 9 may be made from $SiO_2$ or an insulating film based thereon, and may be formed by oxidizing the SiGe layers 3 and the Si layers 4 using a thermal oxidation method or a plasma oxidation method. The film thickness is desired to be in a range of 1 to 3 nm.

In the structure shown in FIG. 2C, a dummy gate 10 and a hard mask 11 are deposited by the CVD method or the like (see FIG. 2D). After patterning and etching the hard mask 11, the dummy gate 10 is etched using the patterned hard mask 11 as a mask. The dummy gate 10 may be made from amorphous Si or polycrystalline (poly) Si. The hard mask 11 is an insulating film containing $Si_3N_4$ or $SiO_2$, or SiON derived therefrom. The hard mask 11 is patterned by selectively using a method such as the SADP or the single exposure in accordance with a gate pitch. For example, the gate pitch is set to 40 to 70 nm, a width of the dummy gate 10 is set in the range of 15 to 30 nm, and the hard mask 11 is patterned. In the etching of the hard mask 11, for example, when $Si_3N_4$ is used as the material of the hard mask 11, an etching selectivity to the underlying dummy gate 10 can be maintained high by adding $Cl_2$ or the like to a mixed gas of $CF_4$ and oxygen. A subsequent etching of the dummy gate 10 may be a selective etching in which the underlying thin film insulating film 5 and the dummy gate insulating film 9 are set as etching stoppers by using a halogen-based gas such as $Cl_2$ or HBr.

After the dummy gate 10 is processed, a gate sidewall spacer 12 is deposited by the CVD method or the like and the spacer is formed only on a gate sidewall by conducting anisotropic etching. A SiON film, a SiOCN film, or a SiCO film which are low dielectric constant films may be used as the gate sidewall spacer 12. When the SiCO film is used for the gate sidewall spacer 12, the anisotropic etching of the gate sidewall spacer 12 may use, for example, a mixed gas obtained by adding a nitrogen ($N_2$) gas to $CF_4$ and octafluorocyclobutane ($C_4F_8$) as an etching gas. A film thickness of the gate sidewall spacer 12 in the horizontal direction is adjusted in a range of 5 to 15 nm.

Next, a hard mask is deposited and patterned to cover a source/drain region of an n-type FET. In an etching using the hard mask as an etching mask, the thin film insulating film 5, the dummy gate insulating film 9, and the stacked films of the SiGe layers 3 and the Si layers 4 in the source/drain region of the p-type FET are etched and removed. At the time, sidewalls of the stacked films of the SiGe layers 3 and the Si layers 4 are exposed at the sidewall of the gate sidewall spacer 12, and the patterned Si substrate 1 is exposed on a surface of the STI insulating film 2. On the above exposed surfaces, a p-type SiGe source/drain 13 is epitaxially grown selective to the surrounding insulating films. Thereafter, the source/drain (not shown) of the n-type FET is formed through a similar process to obtain a structure shown in FIG. 2D. A highly doped n-type Si is selectively grown in the source/drain region of the n-type FET. The selective growth of the p-type SiGe source/drain 13 and the n-type Si source/drain is performed by epitaxial growth using a CVD apparatus, and $SiH_4$, $Si_2H_6$, $GeH_4$ diluted with hydrogen is used as a source gas, diborane ($B_2H_6$) diluted with hydrogen is used as a p-type doping gas, and phosphine ($PH_3$) diluted with hydrogen or helium gas is used as n-type doping gas. Hydrogen chloride gas (HCl) is added as necessary in order to improve selectivity by performing growth in a hydrogen gas atmosphere.

After insulating films 14 are deposited on the structure in FIG. 2D (see FIG. 2E), surfaces are planarized by CMP or the like so that the n-type Si source/drain and the p-type SiGe source/drain are covered with the insulating film 14. Further, the dummy gate 10 is etched and removed by using the insulating film 14 and the gate sidewall spacer 12 as an etching mask. Thereafter, the thin insulating film 5, the dummy gate insulating film 9, and the SiGe layer 3 (sacrificial layer) are removed to obtain a structure in FIG. 2E. Etching of the dummy gate 10 is performed under isotropic etching conditions using a halogen-based gas such as $Cl_2$ or HBr.

FIG. 3 is a plan view (schematic view) of FIG. 2E as viewed from above. A line segment a-a' in FIG. 3 shows a line segment drawn in a direction parallel to a gate in a gate formation region of the FET. FIG. 1A shows a cross-section along the line segment a-a', and a region sandwiched by dotted lines is a region corresponding to a frame A in FIG. 3.

FIG. 1A shows a gate insulating film 21, a p-work function control metal film (hereinafter, work function control metal for p-type FET is referred to as "p-work function control metal") 22, a hard mask 23, antireflection films 24, and photoresists 25 deposited on the structure shown in FIG. 2E or FIG. 3. The photoresists 25 and the antireflection films 24 are patterned. Here, the gate insulating film 21 may be high dielectric materials such as hafnium oxide ($HfO_2$) and aluminum oxide ($Al_2O_3$) or a stacked film of the high dielectric materials for a purpose of improving transistor operation controllability by the gate. Adding a metal material such as zirconium (Zr), lanthanum (La), or yttrium (Y) to the high dielectric material is effective in improving characteristics of the gate insulating film. A thickness of the gate insulating film 21 is about 0.5 to 3 nm. Further, before the gate insulating film 21 is formed, a thin $SiO_2$ layer may be formed on a surface of the channel Si by about 0.5 to 1 nm by thermal oxidation or plasma oxidation. Titanium nitride (TiN) or tantalum nitride (TaN), or a metal compound having a work function equivalent thereto is used as the p-work function control metal film 22. The p-work function control metal film 22 may be a single layer film or a stacked film obtained by combining the above films. A film thickness of the p-work function control metal film 22 is adjusted in a range of about 1 to 12 nm. In FIG. 1A, each of the stacked films of the hard mask 23, the antireflection films 24, and the photoresists 25 is desired to be a tri-layer resist including a spin-on-carbon film, a spin-on-glass film and an organic resist. In this case, planarization can be realized together with the formation of the films since the films are formed by coating. However, a film containing carbon may be deposited as the hard mask 23 by a CVD method or the like, and an inorganic film such as SiON may be used as the antireflection films 24.

FIG. 1A shows a boundary pattern between an n-type FET region and a p-type FET region. Therefore, in the n-type FET region, it is necessary to replace the p-work function control metal film 22 with n-work function control metal film (hereinafter, work function control metal for n-type FET is referred to as "n-work function control metal"). Hereinafter, a process of replacing the work function control metal film will be described. The pattern which is necessary in the process is not limited to a boundary between the p-type FET region and the n-type FET region, and for example, may be a boundary between an n-type FET region having a high threshold voltage and an n-type FET region having a low threshold voltage, or a boundary between a p-type FET region having a high threshold voltage and a p-type FET region having a low threshold voltage.

After forming the structure in FIG. 1A, the hard mask 23 is partially patterned using the photoresists 25 and the antireflection films 24 as etching masks to obtain the structure in FIG. 1B. The boundary of the pattern is located on the FET isolation insulating film 7 that separates the p-type FET region and the n-type FET region in a plan view, and for the etching of the hard mask 23, etching time is controlled to stop at a stage where the part of the p-work function control metal film 22 covering an upper end of the FET isolation insulating film 7 is exposed.

Thereafter, a protective insulating film 26 is deposited by a film forming technique according to an atomic layer deposition (ALD) method, and a structure shown in FIG. 1C is obtained. The protective insulating film 26 is deposited on upper surfaces and sidewalls of the antireflection films 24, sidewalls and an etched planar surface of the opened hard mask 23, and the exposed p-work function control metal film 22. The material of the protective insulating film 26 is desired to be an insulating film containing nitrogen, and is, for example, a $Si_3N_4$ film or a SiON film derived therefrom in consideration of an etching selectivity to the hard mask 23 which is a carbon-based material. A film thickness of the protective insulating film 26 is controlled to be about 2 to 3 nm. The ALD method has an advantage that a thin film can be formed with good conformity even for complex shapes with a lot of convex or concave surfaces. The protective insulating film 26 may be formed by the CVD method or the like.

Next, anisotropic selective etching is performed, and the protective insulating film 26 is etched in a vertical direction to obtain a structure shown in FIG. 1D. According to the etching, a state is achieved in which a part of the sidewalls of the antireflection films 24 and the sidewalls of the hard mask 23 are covered with the protective insulating film 26.

From the state of FIG. 1D, isotropic selective etching is performed to remove the hard mask 23 from the n-type FET region to obtain a structure shown in FIG. 1E. The p-type FET region is not affected by the isotropic etching for removing the mask material from the n-type FET region since the upper surface of the hard mask 23 in the p-type FET region is covered with the antireflection films 24 and the sidewalls are protected by the protective insulating film 26 and the insulating films 7. That is, during a period of removing the mask material from the n-type FET region, the mask material in the p-type FET region is not removed beyond the boundary between the n-type FET region and the p-type FET region.

When such a process of removing the mask material between stacked channels is performed by the plasma processing apparatus having an ALD film forming function, a series of processes from the anisotropic etching of the hard mask 23 shown in FIG. 1B to the isotropic etching of the hard mask 23 shown in FIG. 1E can be continuously processed in the same plasma processing apparatus. The plasma processing apparatus may be any one of an etching apparatus using inductively coupled plasma (ICP), an etching apparatus using capacitively coupled plasma (CCP), and an etching device using microwave electron cyclotron resonance (ECR) plasma.

As an example, FIG. 4 shows a configuration of a plasma processing apparatus using the microwave ECR plasma. The plasma processing apparatus includes a processing chamber (chamber) 401. The processing chamber 401 is connected to a vacuum exhaust apparatus (not shown) via a vacuum exhaust port 402. An inside of the processing chamber 401 is maintained at a vacuum of about 0.1 to 10 Pa during plasma processing. A shower plate 403 and a window portion 404 are disposed in an upper portion of the processing chamber 401. The shower plate 403 has a plurality of holes, and a material thereof is, for example, quartz. A gas supply facility includes a gas source 405, a gas supply device 406, and a gas introduction port 407, and supplies a source gas used for the plasma processing. The gas source 405 has a plurality of gas species necessary for the processing. The gas supply device 406 includes a control valve that controls supply/shutoff of gas and a mass flow controller that controls a flow rate of the gas. The gas introduction port 407 is placed between the shower plate 403 and the window portion 404, and introduces the gas into the process chamber 401 through the holes of the shower plate 403. The window portion 404 has a function of transmitting electromagnetic waves from an upper part of the processing chamber and hermetically sealing the upper part of the processing chamber. A dielectric such as quartz is used as the material of the window portion 404.

A waveguide tube 409 through which electromagnetic waves propagate is connected to the upper portion of the processing chamber 401, and a radio frequency power supply for plasma production 408 is connected to an end portion of the waveguide tube 409. The plasma generating radio frequency power supply 408 is a power supply that generates electromagnetic waves for plasma production. For example, a microwave having a frequency of 2.45 GHz is used as an electromagnetic wave. The microwave generated from the radio frequency power supply for plasma production 408 propagates through the waveguide tube 409 and enters the processing chamber 401. The microwave enters vertically to the processing chamber 401 since the waveguide tube 409 includes a vertical waveguide tube extending in the vertical direction and a waveguide tube converter that also serves as a corner that changes a direction of the microwave by 90 degrees. The microwave propagates vertically in the processing chamber 401 through the window portion 404 and the shower plate 403. Magnetic field generating coils 410 disposed on an outer periphery of the processing chamber 401 forms a magnetic field in the processing chamber 401. The microwaves oscillated from the radio frequency power supply for plasma production 408 generates a high density plasma in the processing chamber 401 by an interaction with the magnetic field formed by the magnetic field generating coils 410.

A sample stage 412 is disposed on a lower side in the processing chamber 401 and faces the window portion 404. Aluminum or titanium is used as the material of the sample stage 412. The sample stage 412 holds a semiconductor substrate 411, which is a sample, placed on an upper surface thereof. Here, center axes of the waveguide 409, the processing chamber 401, the sample stage 412, and the semiconductor substrate 411 coincide with each other. An electrode that electrostatically attracts the semiconductor substrate 411 is provided inside the sample stage 412, and the semiconductor substrate 411 is electrostatically attracted to the sample stage 412 by a DC voltage supply. Further, a radio frequency voltage is applied to the sample stage 412 from a radio frequency bias power supply 413 that controls isotropic/anisotropic of the etching. A frequency of the radio frequency bias to be applied may be, for example, 400 kHz.

Each facility of the plasma processing apparatus is controlled by a controlling unit 420 (connections with each mechanism are omitted in FIG. 4). The controlling unit 420 controls each mechanism by instructing each facility to execute a predetermined operation in accordance with processing conditions (etching processing, ALD film formation processing, and the like) executed by the plasma processing apparatus. For example, the plasma generating radio frequency power supply 408 is controlled to control ON and OFF of electromagnetic waves for plasma generation. The gas supply mechanism is controlled so that a type and a flow rate of the gas to be introduced into the processing chamber 401 are adjusted. The radio frequency bias power supply 413 is controlled to control an intensity of the radio frequency voltage applied to the semiconductor substrate 411 on the sample stage 412.

A flow diagram of the process of removing a mask material between stacked channels is shown in FIG. 5.

First, an etching time is controlled, and the hard mask 23 is etched by vertical etching (S10, FIG. 1B). In the process, it is necessary to maintain verticality of the hard mask sidewalls relative to a surface of the Si substrate, and a radio frequency bias is applied to the sample stage 412 on which the Si substrate 1 is placed. Accordingly, ions are attracted to the substrate and the hard mask 23 is vertically etched. It is also possible to etch the hard mask 23 in the same apparatus continuously with the etching of the antireflection film 24 such as the spin-on-glass film deposited on the upper portion of the hard mask 23. In this case, the etching of the spin-on-glass film 24 is conducted by using the photoresist 25 as an etching mask, using sulfur hexafluoride ($SF_6$) or a fluorocarbon gas such as $CF_4$ or $C_4F_8$ or a mixed gas thereof as an etching gas. At the time of the etching of the hard mask 23 containing a carbon-based material such as spin-on-carbon by using the spin-on-glass film 24 as the mask, gas species are switched and etching is performed using oxygen gas as a main source gas for the etching.

After the etching of the hard mask 23 (S10), the protective insulating film 26 is formed in the same processing chamber in the same plasma processing apparatus as the etching, or in a processing chamber for film deposition connected to the processing chamber for etching via a vacuum transfer chamber (S11). The protective insulating film 26 is desired to be $Si_3N_4$ or a film based thereon in order to obtain a sufficient etching selectivity to the hard mask 23 which is a carbon-based material. For example, when a $Si_3N_4$ film is formed by ALD, the source material for Si is bis(tert-butylamino)silane (BTBAS) or bis(diethylamino)silane (BDEAS) which are liquid raw materials, or dichlorosilane ($SiH_2Cl_2$) which is a gas. When a liquid material is used, the raw material is vaporized and sent to a gas line. The source material is supplied to the processing chamber together with argon (Ar), which is a carrier gas, and is adsorbed on the surface of the structure in FIG. 1B as a precursor of Si. Thereafter, an unnecessary precursor in the processing chamber is exhausted by using a purge gas such as Ar gas, and then a gas containing nitrogen such as $N_2$ gas, a mixed gas of $N_2$ gas and hydrogen ($H_2$) gas, or ammonia ($NH_3$) gas is introduced to form plasma and cause a surface reaction. Thereafter, purging is performed again with an inert gas such as Ar, and unnecessary gas in the processing chamber is exhausted. By the series of processes, a $Si_3N_4$ film having an atomic layer level film thickness in principle is deposited. By repeating the series of processes, a thin ALD insulating film as shown in FIG. 1C is formed.

Next, the protective insulating film 26 is partially etched by anisotropic etching (S12). A gas such as trifluoromethane ($CHF_3$), difluoromethane ($CH_2F_2$) or fluoromethane ($CH_3F$), or a mixed gas of hydrogen and a fluorocarbon gas such as $CF_4$ and $C_4F_8$ is used for the etching gas. Accordingly, the protective insulating film 26 made of the $Si_3N_4$ film can be selectively etched relative to the hard mask 23 containing the carbon-based material such as spin-on-carbon. In order to maintain a condition in which the sidewalls of the opened hard mask 23 in the structure in FIG. 1D are uniformly covered with the protective insulating film 26, the radio frequency bias is adjusted and the etching time period is controlled so as to minimize an etching amount in the horizontal direction of the protective insulating film 26. The etching time period is adjusted to about 1.5 to 2 times of a time period required for etching the protective insulating film 26 in a direction vertical to the substrate so that the protective insulating film 26 does not remain on an upper planar surface of the hard mask 23 etched (S10) in the n-type FET region, thereby ensuring an overetching amount.

Subsequently, the hard mask 23 containing a carbon-based material such as spin-on-carbon is isotropically etched (S13). As shown in FIG. 1E, in the process, the hard mask 23 is selectively etched relative to the antireflection film 24 including a spin-on-glass film or a film derived therefrom, the protective insulating film 26 formed on the sidewalls of the opened hard mask 23, and further, the p-work function control metal film 22 including a film containing TiN, TaN or the like. Oxygen gas is used for the etching. Since the etching is isotropic, a bias is not applied to the Si substrate, and etching by oxygen radicals generated by the plasma is performed.

In the case where the protective insulating film 26 is a $Si_3N_4$ film or a film derived therefrom, an etching selectivity of the protective insulating film 26 to the hard mask 23 containing the carbon-based material such as spin-on-carbon can be set to 10 to 50. Therefore, when the film thickness of the protective insulating film 26 is about 3 nm, the etching of the hard mask 23 in the horizontal direction can be performed at about 30 nm or more. Since the width of a typical nanowire or nanosheet channel is about 5 to 30 nm, it is sufficiently possible to remove the mask material remaining between stacked nanowire or nanosheet channels while protecting the hard mask 23 in the region to be protected by the protective insulating film 26. When there is an application requiring a wider nanosheet channel, an initial film thickness of the protective insulating film 26 may be adjusted accordingly.

In order to perform the process of removing a mask material between stacked channels described above using the same plasma processing apparatus, anisotropic etching with high precision/high selectivity, ALD film formation, and highly selective isotropic etching are needed, and for example, highly accurate gas flow rate/temperature/pressure controllability is required for achieving high etching selectivity and highly accurate control of etching speed. When the above-described different processes (anisotropic etching/ ALD film formation/isotropic etching) are continuously performed in the same apparatus, a throughput can be improved, oxidation and the like of the mask material by exposing the wafer to standby during the process can be prevented and a yield can be improved.

The work function control metal replacement process and the low resistance gate metal forming process subsequent to the process of removing a mask material between stacked channels will be described with reference to FIGS. 6A to 6E. The antireflection films 24 and the protective insulating film 26 are removed from the structure shown in FIG. 1E to obtain a structure in FIG. 6A. Here, the antireflection film 24 including the spin-on-glass film or a film derived therefrom is selectively etched relative to the hard mask 23 containing a carbon-based material such as spin-on-carbon and the protective insulating film 26 including a $Si_3N_4$ film or a film based thereon by using a $SF_6$ gas, a fluorocarbon gas such as $CF_4$ or $C_4F_8$, or a mixed gas thereof. Isotropic or anisotropic etching conditions can be used. Subsequently, the protective insulating film 26 is etched selective to peripheral layers including the hard mask 23 by using $CHF_3$, $CH_2F_2$, $CH_3F$, or a mixed gas of $CF_4$, $C_4F_8$ or the like and hydrogen as a source gas. The isotropic etching condition is used for the etching. The etching of the antireflection film 24 and the protective insulating film 26 can be performed in the same plasma processing apparatus continuously with the above-described process of removing a mask material between stacked channels.

From the structure in FIG. 6A, the p-work function control metal film 22 is removed from n-type FET region by isotropic dry etching or wet etching using the hard mask 23 containing a carbon-based material such as spin-on-carbon as an etching mask. The p-work function control metal film 22 is made from TiN, TaN or a film based thereon. When dry etching is performed, a mixed gas of CHF₃ and Ar or the like may be used, and when wet etching is performed, an ammonia hydrogen peroxide solution (ammonia peroxide mixture: NH₃/H₂O₂/H₂O) may be used.

From the structure in FIG. 6B, the hard mask 23 is removed in an oxygen plasma atmosphere or the like to obtain the structure in FIG. 6C, and an n-work function control metal film 27 is deposited on an entire surface to obtain the structure in FIG. 6D. Here, the n-work function control metal film 27 may be made from titanium aluminum (TiAl) or a metal containing carbon (C), oxygen (O), nitrogen (N), or the like in TiAl. The n-work function control metal film 27 is formed by the CVD method or the ALD method.

Thereafter, a low resistance gate metal 28 is deposited and planarized by CMP to obtain a structure shown in FIG. 6E. The low resistance gate metal 28 is deposited for a purpose of reducing the metal resistance in the gate, and a material such as tungsten (W) can be used.

In FIG. 6E, on a nanowire or nanosheet channel 4 in the n-type FET region, the n-work function control metal film 27 is formed via the gate insulating film 21, while the p-work function control metal film 22 is formed on the nanowire or nanosheet channel 4 in a p-type MOSFET region via the gate insulating film 21. No unintentionally removed p-work function control metal film exists in the work function control metal film replacement process even though the distance between n-type FET and the p-type FET is reduced by applying the FET isolation insulating film 7 between the two FETs. Further, the gate resistance is reduced since the low-resistance gate buried metal film 28 is deposited between the stacked nanowire channels or nanosheet channels.

As described above, the work function control metal can be replaced in accordance with a required value of a threshold voltage of the FET while taking advantage of a fact that a distance between FETs in the horizontal direction can be reduced in the nanosheet fork type FETs. Although an example in which a p-work function control metal film is formed first has been described, an n-work function control metal film may be formed first and being replaced by a p-work function control metal film.

Second Embodiment

In the second embodiment, MOSFETs having different threshold voltages are achieved by separately forming stacked films of work function control metals. FIG. 7A is a plan view of FIG. 2E as viewed from above. Channels of eight MOSFETs shown in FIG. 7A are channels of n-type FETs (nMOSs-1 to 3) and p-type FETs (pMOSs-1 to 3) each having three threshold voltages, and a stacked film of work function control metal is deposited on the channels in accordance with a required value of a threshold voltage. The same reference numerals are given to MOSFETs having the same threshold voltage.

FIG. 7A shows a state in which the structure in FIG. 6C is obtained in the work function control metal replacement process described in the first embodiment. The p-work function control metal film 22 is stacked on channels included in a region 30, that is, the channels of the nMOS-2, 3 and the pMOS-1 to 3. Here, since a process of depositing a plurality of types of work function control metals is assumed, the p-work function control metal film 22 is referred to as p-WFM-1 (WFM: work function metal).

Next, in FIG. 7B, after the deposition of the n-work function control metal film 27 (see FIG. 6D) in the work function control metal replacement process described in the first embodiment, the n-work function control metal film 27 is removed from the channel of pMOS-1. In the process, the hard mask 23, the antireflection film 24, and the photoresist 25 are deposited on the structure in FIG. 6D, a region corresponding to the channel of the pMOS-1 is opened, and the process of removing a mask material between stacked channels described in the first embodiment is performed. Accordingly, the n-work function control metal film 27 on the channel of the pMOS-1 is exposed and removed. As a result, the n-work function control metal film 27 is stacked on the channels included in the region 31, that is, the channels of the nMOS-1 to 3 and the pMOS-2, 3. The n-work function control metal film 27 is referred to as n-WFM-1.

FIG. 7C further shows depositing an n-work function control metal film (n-WFM-2) on the structure in FIG. 7B and removing the n-work function control metal film (n-WFM-2) from the channels of nMOS-3 and pMOS-1, 3. The process can be performed by conducting the process of removing a mask material between stacked channels described in the first embodiment. The n-work function control metal film (n-WFM-2) on the exposed channels of the nMOS-3 and pMOS-1, 3 are removed. As a result, the n-work function control metal film (n-WFM-2) is stacked on the channels included in a region 32, that is, the channels of the nMOS-1, 2 and pMOS-2. A work function control metal stacked film stacked on each MOSFET is shown in FIG. 7D according to the above process.

By the series of processes described above, a plurality of types of work function control metal stacked films can be formed in each of the n-type FET and the p-type FET. The p-WFM-1 is desirably a film containing TiN or TaN, or a film derived from a stacked film thereof, and the film thickness of the p-WFM-1 is desirably 1 to 4 nm. For the etching of the p-WFM-1, isotropic dry etching or wet etching is performed. When dry etching is performed, although a mixed gas of CHF₃ and Ar may be used as described above, an atomic layer etching (ALE) capable of etching at an atomic layer level may be used, and when wet etching is performed, an ammonia hydrogen peroxide aqueous solution or the like is used.

It is desirable that a material such as TiAl, a metal containing C, O, N or the like in TiAl, titanium carbide (TiC), or titanium oxide (TiO) is used as the n-WFM-1, and the film thickness may be 1 to 4 nm. The etching of the n-WFM-1 may be performed by controlling the etching speed with high accuracy using ALE or the like, or by using the wet etching which is excellent in etching selectivity with an underlying p-WFM-1 film. A high etching selectivity to the p-WFM-1 containing TiN or TaN can be obtained when an alkali based etching solution such as potassium hydroxide (KOH) or ammonium hydroxide (NH₄OH) is used for wet etching in the case that the n-WFM-1 is made from a material containing TiAl as a main part.

Similar to the n-WFM-1, a material such as TiAl, a metal containing C, O, N, or the like in TiAl, TiC, TiO or the like is used as the n-WFM-2. The composition of the material constituting the film may be the same as or different from that of the n-WFM-1. When the composition is different from that of the n-WFM-1, selective etching with the n-WFM-1 becomes possible. When a material having the same composition as that of the n-WFM-1 is used, the etching of the n-WFM-2 is performed by controlling the etching amount by using ALE or the like. The film thickness of the n-WFM-2 may be 1 to 4 nm.

The threshold voltage of the p-type FET can be changed by forming the n-work function control metal film on the p-work function control metal film. For example, when TiAl or a film based thereon is used as the n-work function control metal film, Al diffuses into the p-work function control metal film due to a thermal budget during the FET manufacturing process, and the threshold voltage (absolute value) of the p-type FET increases. The Al diffusion depends on the film thickness of the n-work function control metal film, and the thicker the film thickness, the more the threshold voltage of the p-type FET increases. On the other hand, when the p-work function control metal film is formed under the n-work function control metal film in the n-type FET, an effect of the n-work function control metal weakens, and the threshold voltage of the n-type FET increases. Therefore, when the threshold voltages (absolute values) of the p-type FET and the n-type FET in the example shown in FIG. 7D are compared separately, the threshold voltages (absolute values) of the p-type FET satisfy pMOS-1<pMOS-3<pMOS-2, and the threshold voltages of the n-type FET satisfy nMOS-1<nMOS-2<nMOS-3.

As described above, an FET having a plurality of types of threshold voltages for each of the n-type and the p-type can be formed by applying the work function control metal replacement process to different regions for a plurality of times. Although the nanosheet fork type FET has been described as an example, the same applies to the GAA type FET.

Third Embodiment

In the third embodiment, a process of separately forming a work function control metal film on a stacked nanowire channel or a stacked nanosheet channel in a device having a GAA type FET will be described. A difference from the first embodiment or the second embodiment will be mainly described, and a repetitive description of the same steps will be omitted. FIGS. 8A to 8C show the channel forming process of the GAA type FET.

FIG. 8A shows a structure in which, after a stacked film of single crystal SiGe layers 53 and single crystal Si layers 54 is epitaxially grown on a Si substrate 51, patterning is performed and an STI insulating film 52 is buried. The manufacturing process is equivalent as the process shown in FIG. 2A of the first embodiment (However, FIG. 8A shows a state after removal of a hard mask for patterning). The Si layer 54 may be located in an uppermost layer when manufacturing a GAA type FET using Si as a channel.

FIG. 8B shows a structure after a dummy gate insulating film 55, a dummy gate 60, and a gate sidewall spacer 62, a SiGe source/drain 63 of the p-type FET, and a Si source/drain (not shown) of the n-type FET are formed. The stack structure of the fin shape SiGe layer 53/Si layer 54 before the formation of the nanowire channel or the nanosheet channel is covered with the dummy gate 60.

FIG. 8C shows a structure after forming an insulating film on the source/drain, removing the dummy gate 60 after planarization by CMP, and selectively removing the SiGe layer 53 relative to the Si layer 54. In the process, the Si layer 54 is formed into a shape of a wire or a sheet in which all outer peripheries are exposed.

FIGS. 9A to 9H show a process of forming work function control metal in the GAA type FET. FIG. 9A shows a structure cross section after lithography for defining a region for separately forming the work function control metal is performed. After manufacturing of the structure in FIG. 8C, a gate insulating film 71 and a p-work function control metal film 72 are formed on the Si layer 54 forming a nanowire channel or a nanosheet channel, a hard mask 73 such as a spin-on-carbon film, an antireflection film 74 such as a spin-on-glass film, and a photoresist 75 are formed or deposited, and the photoresist 75 is patterned to obtain a structure in FIG. 9A.

An insulating film such as $SiO_2$ is deposited on the structure shown in FIG. 9A, and anisotropic etching is performed to form an auxiliary insulating film 76 to obtain a structure shown in FIG. 9B. The auxiliary insulating film 76 serves as a sidewall of the photoresist 75 and has a role of expanding a pattern region defined by the photoresist 75. Here, a film thickness d of the auxiliary insulating film 76 is adjusted so that the sidewall end of the auxiliary insulating film 76 is located on a stacked channel in an n-type FET region closest to a p-type FET region in a plan view. Further, as will be described later, the sidewall end of the auxiliary insulating film 76 is desired to be located closer to the p-type FET region than a center of the channel.

Thereafter, the antireflection film 74 is etched by anisotropic etching using the photoresist 75 and the auxiliary insulating film 76 as a mask, and then the hard mask 73 is etched by time-controlled anisotropic etching to obtain a structure shown in FIG. 9C. Here, the etching of the hard mask 73 is controlled such that the etching time period is controlled to stop at a time point when the p-work function control metal film 72 on the uppermost nanowire channel or the nano sheet channel 54 is exposed. Therefore, it is necessary to pay attention that the uppermost channel is not fully exposed.

Next, a thin insulating film 77 is formed by the ALD method or the CVD method to obtain a structure shown in FIG. 9D. Here, a film type of the insulating film 77 is a $Si_3N_4$ film or a film based thereon, which is similar as that in the first embodiment, and film forming conditions and the like are similar as those in the first embodiment.

Next, the protective insulating film 77 for protecting sidewalls of the opened hard mask 73 is formed by processing the thin insulating film 77 by vertical etching (FIG. 9E). Subsequently, the hard mask 73 is vertically etched by using the antireflection film 74 and the protective insulating film 77 on the sidewall of the hard mask 73 as a mask to obtain a structure shown in FIG. 9F. By the etching, the sidewall of the hard mask 73 between the stacked channels remaining in the n-type FET region is exposed.

For the structure shown in FIG. 9F, the hard mask 73 is etched by isotropic etching to obtain a structure shown in FIG. 9G. The etching is performed by controlling an etching time and is stopped at a position where the sidewall position of the hard mask 73 remaining after etching is substantially close to the sidewall position of the hard mask 73 protected by the protective insulating film 77 in the stacked channel closest to the p-type FET region. In the etching, the sidewall position of the hard mask 73 remaining after the etching is located closer to the p-type FET region than the center of the nanowire or the nano sheet channel 54. Accordingly, in the stacked channel layer located inside the n-type FET region, more than half of the width of the channel can be etched from each of the exposed side surfaces of the hard mask 73 between the nanowire or nanosheet channels 54, and the mask material remaining between the nanowire or nanosheet channels can be completely removed.

Isotropic etching of the hard mask 73 is performed to obtain a structure shown in FIG. 9H after etching and removing the protective insulating film 77 from the structure shown in FIG. 9G. Accordingly, vertical sidewalls of the hard mask 73 can be obtained by combining anisotropic etching and isotropic etching. As described above, by setting the boundary to be etched by isotropic etching closer to the p-type FET region from the center of the stacked nanowire or nanosheet channel closest to the p-type FET region, the etching amount of the isotropic etching of the hard mask 73 can be optimized, and the boundary between the n-type FET region and the p-type FET region can be precisely controlled.

The hard mask removal process between the stacked nanowire or nanosheet channels in the third embodiment described above is summarized in FIG. 10. Conditions for each etching or film formation of protective insulating film may be similar as those in the first embodiment. The process of FIG. 10 can also be continuously processed as a series of processes in the same plasma processing apparatus as described in the first embodiment. Following the process of removing a mask material between stacked channels, the GAA type FET can be manufactured by executing the work function control metal replacement process and the low resistance gate metal layer forming process similar as in the first embodiment.

The work function control metal separately forming process shown in the third embodiment can be repeated a plurality of times by changing a mask region, and a MOS-FET having a plurality of types of threshold voltages for each of the n-type and the p-type can be formed similarly as in the second embodiment.

Fourth Embodiment

In the fourth embodiment, a gate insulating film is separately formed in accordance with a required value of a threshold voltage of a MOSFET. FIG. 11A shows a structure in which nanowire or nanosheet channels 84 are formed on a Si substrate 81 and then a gate insulating film 101 and a p-work function control metal film 102 are formed. In the embodiment, a threshold voltage adjusting film 103 is formed between the gate insulating film 101 and the p-work function control metal film 102. Similar as that in the first embodiment, the gate insulating film 101 is made from a high dielectric material such as $HfO_2$ or $Al_2O_3$ or a film based thereon. A metal oxide film such as lanthanum oxide ($La_2O_3$) or magnesium oxide (MgO) is used as the threshold voltage adjusting film 103. FIG. 11A shows an example in which a region for separately forming a work function control metal is a p-type FET (low Vt) region having a low threshold voltage and a p-type FET (high Vt) region having a high threshold voltage, respectively. The structure in FIG. 11B is obtained by adopting the process forming the work function control metal separately according to the third embodiment on the structure in FIG. 11A. Subsequently, the p-work function control metal film 102 and the threshold voltage adjusting film 103 are removed from the p-type FET (low Vt) region from which the hard mask 93 is removed, and then the antireflection film 94 and the hard mask 93 are removed from the p-type FET (high Vt) region to obtain a structure shown in FIG. 11C.

Next, when the structure in FIG. 11C is subjected to a heat treatment, a metal material such as La or Mg is diffused into the gate insulating film 101 in the p-type FET (high Vt) region, and is changed to a second gate insulating film 104 (FIG. 11D). In the second gate insulating film 104, a dipole is formed in the gate insulating film by the effect of La, Mg, or the like, and a positive electric field is applied to a channel surface of the FET due to an effect of polarization induced by the dipole. As a result, the density of holes serving as carriers decreases on the channel surface of the p-type FET, and the threshold voltage increases. In the case of an n-type FET, the threshold voltage decreases since the density of electrons serving as carriers increases on the surface of the channel.

Thereafter, a structure shown in FIG. 11E is obtained when the p-work function control metal film 102 and the threshold voltage adjustment film 103 are removed from the p-type FET (high Vt) region. Thereafter, by forming the p-work function control metal film again, it is possible to form an FET having a different threshold voltage while having the same work function control metal film.

Accordingly, it is possible to manufacture a plurality of FETs having different threshold voltages without making the work function control metal film a complicated stacked film or changing the film thickness, which can decrease the thickness of the work function control metal film. Thereby, the process can contribute to further reduction in gate length and the like. Although the GAA type FET has been described as an example, the same applies to the nanosheet fork type FET.

REFERENCE SIGN LIST 1, 51, 81 silicon substrate
2, 52, 82 shallow trench isolation (STI) insulating film
3, 53 single crystal silicon germanium layer
4, 54, 84 single crystal silicon layer
5 thin insulating film
6, 61 hard mask
7 FET isolation insulating film
8 resist
9, 55 dummy gate insulating film
10, 60 dummy gate
11, 61 hard mask
12, 62 gate sidewall spacer
13, 63 p type SiGe source/drain
14, 64 insulating film
21, 71, 101 gate insulating film
22, 72, 102 p-work function control metal film
23, 73 hard mask
24, 74 antireflective film
25, 75 photoresist
76 insulating film
26, 77 protective insulating film
27 n-work function control metal film
28 gate buried metal film
30 to 32 region
103 threshold voltage adjustment film
104 second gate insulating film
401 processing chamber
402 vacuum exhaust port
403 shower plate
404 window portion
405 gas source
406 gas supply device
407 gas introduction port
408 plasma generating radio frequency power supply
409 waveguide tube
410 magnetic field generation coil
411 semiconductor substrate
412 sample stage
413 radio frequency bias power supply
420 control unit

The invention claimed is:
1. A manufacturing method of a semiconductor device having a plurality of stacked channels in which each of the stacked channels has a shape of a wire or a sheet and is stacked in a direction vertical to a substrate in a gate formation region, wherein the semiconductor device includes a first structure body including a first FET insulating film and wherein the stacked channels are insulated and isolated by the first FET insulating film, and the manufacturing method of the semiconductor device comprises:

a first step of forming a gate insulating film and a first work function control metal film on the first structure body, and burying the gate formation region with a mask material;

a second step after the first step of performing anisotropic etching to open the mask material until the first work function control metal film covering an upper end of the first FET insulating film is exposed by a pattern having one end located on the first FET insulating film in a plan view;

a third step of depositing a protective film after the second step;

a fourth step after the third step of performing anisotropic etching to remove the protective film while remaining the protective film deposited on sidewalls of the mask material opened in the second step;

a fifth step of performing isotropic etching after the fourth step to remove the mask material located in the pattern in a plan view selective to the protective film and the first work function control metal film;

a sixth step of removing the protective film deposited on the sidewalls of the mask material and the first work function control metal film exposed by the fifth step after the fifth step;

a seventh step of removing the mask material in the gate formation region after the sixth step; and an eighth step of forming a second work function control metal film on the exposed first structure body after the seventh step.

2. The manufacturing method of the semiconductor device according to claim 1, wherein the semiconductor device includes a first MOSFET having a first threshold voltage and a second MOSFET having a second threshold voltage, a first work function control metal stacked film is formed on the stacked channels of the first MOSFET, and a second work function control metal stacked film is formed on the stacked channels of the second MOSFET, and the first work function control metal stacked film and the second work function control metal stacked film have different stacked numbers or different work function control metals constituting a stacked film.

3. The manufacturing method of the semiconductor device according to claim 1, wherein the semiconductor device includes a first MOSFET having a first threshold voltage and a second MOSFET having a second threshold voltage, a threshold voltage adjusting film is formed between the gate insulating film and the first work function control metal film in the first step, and the method includes a step of removing the threshold voltage adjusting film from the stacked channels of the first MOSFET, and remaining the threshold voltage adjusting film on the stacked channels of the second MOSFET and performing a heat treatment to the threshold voltage adjusting film.

4. The manufacturing method of the semiconductor device according to claim 1, wherein the second to fifth steps are performed in the same plasma processing apparatus.

* * * * *